United States Patent
Yang et al.

(10) Patent No.: US 12,548,495 B2
(45) Date of Patent: Feb. 10, 2026

(54) LIGHT-EMITTING SUBSTRATE AND DISPLAY DEVICE HAVING TWO SYMMETRICAL POSITIVE VOLTAGE LINES

(71) Applicant: BOE Technology Group Co., Ltd., Beijing (CN)

(72) Inventors: Ming Yang, Beijing (CN); Liwei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 114 days.

(21) Appl. No.: 18/026,478

(22) PCT Filed: May 27, 2022

(86) PCT No.: PCT/CN2022/095701
§ 371 (c)(1),
(2) Date: Mar. 15, 2023

(87) PCT Pub. No.: WO2023/226017
PCT Pub. Date: Nov. 30, 2023

(65) Prior Publication Data
US 2024/0296781 A1    Sep. 5, 2024

(51) Int. Cl.
*G09G 3/32* (2016.01)
*H01L 25/075* (2006.01)
(Continued)

(52) U.S. Cl.
CPC .......... *G09G 3/32* (2013.01); *H01L 25/0753* (2013.01); *H10H 20/857* (2025.01); *H10H 29/142* (2025.01); *G09G 2320/0233* (2013.01)

(58) Field of Classification Search
CPC .............. G09G 3/32; G09G 2320/0233; H01L 25/0753; H01L 27/156; H01L 33/62
See application file for complete search history.

(56) References Cited

U.S. PATENT DOCUMENTS

2013/0168661 A1   7/2013 Min et al.
2014/0285535 A1   9/2014 Pyo
(Continued)

FOREIGN PATENT DOCUMENTS

CN   103460431 A   12/2013
CN   107644621 A   1/2018
(Continued)

OTHER PUBLICATIONS

Li et al., Machine Translation of Foreign Patent Document CN 111812888A, Mini LED backlight module, preparation method thereof and display panel, Oct. 23, 2020, pp. 1-27 (Year: 2020).*

*Primary Examiner* — Amr A Awad
*Assistant Examiner* — Maheen I Javed
(74) *Attorney, Agent, or Firm* — IPro, PLLC

(57) ABSTRACT

Provided in embodiments of the disclosure are a light-emitting substrate and a display device. The light-emitting substrate has a light-emitting area and a peripheral area arranged around the light-emitting area, and the light-emitting substrate includes: a plurality of light-emitting control units distributed in an array in the light-emitting area; wherein each of the light-emitting control units includes at least one sub-light-emitting unit, and the plurality of light-emitting control units are divided into at least two areas; at least two positive voltage lines located in the peripheral area and respectively located on opposite sides of the plurality of light-emitting control units; wherein sub-light-emitting units of light-emitting control units in a same area are electrically connected to a same positive voltage line, and sub-light-emitting units of light-emitting control units in different areas are electrically connected to different positive voltage lines.

16 Claims, 18 Drawing Sheets

(51) Int. Cl.
*H10H 20/857* (2025.01)
*H10H 29/14* (2025.01)

(56) References Cited

U.S. PATENT DOCUMENTS

| | | |
|---|---|---|
| 2018/0059458 A1 | 3/2018 | Chen |
| 2020/0110307 A1* | 4/2020 | Chang ............... G02F 1/133603 |
| 2022/0005989 A1* | 1/2022 | Ban ........................ H01L 33/12 |
| 2022/0172669 A1* | 6/2022 | Liu ........................ G09G 3/32 |
| 2023/0143518 A1 | 5/2023 | Li |

FOREIGN PATENT DOCUMENTS

| | | | | |
|---|---|---|---|---|
| CN | 107978282 A | | 5/2018 | |
| CN | 109346016 A | | 2/2019 | |
| CN | 109830207 A | | 5/2019 | |
| CN | 110649059 A | | 1/2020 | |
| CN | 111812888 A | * | 10/2020 | ....... G02F 1/133603 |
| CN | 112767880 A | * | 5/2021 | ........... G09G 3/3208 |
| CN | 113066920 A | | 7/2021 | |
| CN | 113671752 A | | 11/2021 | |
| KR | 100669766 B1 | * | 1/2007 | ........... H10K 59/131 |
| KR | 102473526 B1 | * | 12/2022 | ........ H01L 27/3276 |
| WO | 2017133042 A1 | | 8/2017 | |
| WO | WO-2020192284 A1 | * | 10/2020 | ........... H10H 29/142 |
| WO | WO-2020227861 A1 | * | 11/2020 | ........... G02F 1/1336 |

\* cited by examiner

LIGHT-EMITTING SUBSTRATE AND DISPLAY DEVICE HAVING TWO SYMMETRICAL POSITIVE VOLTAGE LINES

CROSS REFERENCE TO RELATED APPLICATIONS

The present disclosure is a US National Stage of International Application No. PCT/CN2022/095701, filed on May 27, 2022, the entire contents of which are incorporated herein by reference.

FIELD

The disclosure relates to the field of display technology, and in particular to a light-emitting substrate and a display device.

BACKGROUND

The direct-type mini/micro Light-Emitting Diode (mini/micro LED) light source with multiple lamp areas, as a light source for a display device, can significantly improve the dynamic contrast ratio of the display device and realize the HDR display, and has become a research hotspot in recent years. As the light source for the display device, the direct-type mini/micro LED light source with multiple lamp areas need to ensure the uniformity of brightness. However, as the current-driven light-emitting device, the voltage difference between the positive and negative poles of two LEDs will cause a current difference, then lead to a brightness difference of the LEDs, and eventually lead to the uneven brightness of the light source.

SUMMARY

Embodiments of the disclosure provide a light-emitting substrate and a display device, and the specific solution is as follows.

An embodiment of the disclosure provides a light-emitting substrate with a light-emitting area and a peripheral area arranged around the light-emitting area, including:
  a plurality of light-emitting control units distributed in an array in the light-emitting area; wherein each of the light-emitting control units includes at least one sub-light-emitting unit, and the plurality of light-emitting control units are divided into at least two areas; and
  at least two positive voltage lines located in the peripheral area and respectively located on opposite sides of the plurality of light-emitting control units; wherein sub-light-emitting units of light-emitting control units in a same area are electrically connected to a same positive voltage line, and sub-light-emitting units of light-emitting control units in different areas are electrically connected to different positive voltage lines.

In a possible implementation, in the above light-emitting substrate according to the embodiment of the disclosure, the plurality of light-emitting control units are divided into two areas in a row direction, the number of the positive voltage lines is two, and the two positive voltage lines are symmetrically arranged about a center of the light-emitting area.

In a possible implementation, in the above light-emitting substrate according to the embodiment of the disclosure, light-emitting control units in each area are divided into at least two sub-areas in a column direction, sub-light-emitting control units of light-emitting control units in a same sub-area are electrically connected to a same positive voltage line, and sub-light-emitting units of light-emitting control units in different sub-areas are electrically connected to different positive voltage lines;
  the positive voltage lines corresponding to the light-emitting control units in each area extend in the column direction and are arranged in the row direction, and each positive voltage line extends to a lead area of the peripheral area; and
  each positive voltage line has a same resistance value.

In a possible implementation, in the above light-emitting substrate according to the embodiment of the disclosure, widths of the positive voltage lines decrease sequentially in a direction where lengths of the positive voltage lines are from large to small in each area.

In a possible implementation, in the above light-emitting substrate according to the embodiment of the disclosure, the positive voltage lines are same in length and width in each area; wherein the positive voltage line with a longest linear distance in the column direction is a straight line, and each positive voltage line with a shorter linear distance in the column direction is a broken line or a curve.

In a possible implementation, in the above light-emitting substrate according to the embodiment of the disclosure, each positive voltage line includes a first end in the lead area and a second end away from the lead area; a bottom edge of a last row of light-emitting control units in each area is a first horizontal reference line, and first parts of the positive voltage lines between the first horizontal reference line and the first end are same in length and width;
  a top side of a last row of sub-light-emitting units in the light-emitting control units in each sub-area is a second horizontal reference line, and second parts of the positive voltage lines between respective second horizontal reference lines and respective second ends are same in length and width; and
  for a third part of each positive voltage line except the first part and the second part, widths of third parts decrease sequentially in a direction where lengths of the third parts are from large to small; or, the third parts are same in length and width, the third part with a longest linear distance in the column direction is a straight line, and each third part with a shorter linear distance in the column direction is a broken line or a curve.

In a possible implementation, the above light-emitting substrate according to the embodiment of the disclosure further includes a plurality of connection lines extending in the row direction, wherein the positive voltage lines are electrically connected to the sub-light-emitting units through the corresponding connection lines, and the connection lines have a same resistance value.

In a possible implementation, in the above light-emitting substrate according to the embodiment of the disclosure, the light-emitting control units in each area are divided into at least two sub-areas in the column direction, and the connection lines electrically connected to the light-emitting control units in each sub-area include first sub-connection lines located in the light-emitting area and second sub-connection lines located in the peripheral area;
  in the column direction, lengths and widths of the second sub-connection lines corresponding to the light-emitting control units in different sub-areas decrease sequentially;
  or, the second sub-connection lines corresponding to the light-emitting control units in different sub-areas are same in length and width, the second sub-connection line with a longest linear distance in the row direction is a straight line, and each second sub-connection line with a shorter linear distance in the row direction is a broken line or a curve.

In a possible implementation, the above light-emitting substrate according to the embodiment of the disclosure further includes a plurality of negative voltage lines, wherein each of the light-emitting control units is electrically connected to at least one of the negative voltage lines, different light-emitting control units are electrically connected to different negative voltage lines, the negative voltage lines are led out from the light-emitting area to the lead area of the peripheral area, and the negative voltage lines have a same resistance value.

In a possible implementation, in the above light-emitting substrate according to the embodiment of the disclosure, each of the negative voltage lines includes a first sub-voltage line located in the light-emitting area and a second sub-voltage line located in the lead area, each first sub-voltage line has a same resistance value, and each second sub-voltage line has a same resistance value.

In a possible implementation, in the above light-emitting substrate according to the embodiment of the disclosure, a width of the first sub-voltage line with a longer length is greater than a width of the first sub-voltage line with a shorter length;

or, the first sub-voltage lines are same in length and width, wherein the first sub-voltage line with a longest linear distance in the column direction is a straight line, and the first sub-voltage line with a shorter linear distance in the column direction is a broken line or a curve.

In a possible implementation, in the above light-emitting substrate according to the embodiment of the disclosure, a width of the second sub-voltage line with a longer length is greater than a width of the second sub-voltage line with a shorter length;

or, the second sub-voltage lines are same in length and width; each of the second sub-voltage lines includes a first vertical part connected to the first sub-voltage line, an inclined part connected to the first vertical part, and a second vertical part connected to the inclined part; all first vertical parts are same in length and width, all second vertical parts are same in length and width, the inclined part with a longest length is a straight line, and each inclined part with a shorter length is a broken line or a curve.

In a possible implementation, in the above light-emitting substrate according to the embodiment of the disclosure, each of the light-emitting control units includes a plurality of sub-light-emitting units with different light-emitting colors distributed in an array, the sub-light-emitting units in a same column have a same light-emitting color, the sub-light-emitting units of different light-emitting color columns are arranged alternately in the row direction, and the sub-light-emitting units of each light-emitting color include m rows and n columns;

in each of the light-emitting control units, the number of connection lines electrically connected to the positive voltage line and extending in the row direction is p, 1≤p≤m, p is a positive integer, and m/p is an integer;

m/p sub-light-emitting units among m sub-light-emitting units with a same light-emitting color in a same column are connected in series; and the number of negative voltage lines included in each light-emitting control unit is at least same as the number of light-emitting colors.

In a possible implementation, in the above light-emitting substrate according to the embodiment of the disclosure, the sub-light-emitting units include a red sub-light-emitting unit, a green sub-light-emitting unit and a blue sub-light-emitting unit.

In a possible implementation, in the above light-emitting substrate according to the embodiment of the disclosure, each of the light-emitting control units includes m rows and n columns of sub-light-emitting units with a same light-emitting color distributed in an array; and in each of the light-emitting control units, the number of connection lines electrically connected to the positive voltage line and extending in the row direction is p, 1≤p≤m, p is a positive integer, and m/p is an integer; and m/p sub-light-emitting units among m sub-light-emitting units in a same column are connected in series.

In a possible implementation, in the above light-emitting substrate according to the embodiment of the disclosure, the sub-light-emitting unit is a blue sub-light-emitting unit.

In a possible implementation, in the above light-emitting substrate according to the embodiment of the disclosure, the sub-light-emitting unit is a Mini LED or Micro LED.

Correspondingly, an embodiment of the disclosure further provides a display device, including the light-emitting substrate described in any one of the above implementations provided in the embodiment of the disclosure.

DETAILED DESCRIPTION OF THE EMBODIMENTS

In order to make the purposes, technical solutions and advantages of the disclosure clearer, the technical solutions of the embodiments of the disclosure will be described clearly and completely below in combination with the accompanying drawings of the embodiments of the disclosure. Obviously the described embodiments are a part of the embodiments of the disclosure but not all the embodiments. Also in the case of no conflict, the embodiments and the features therein in the disclosure can be combined with each other. Based upon the embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The word such as "include" or "contain" or the like used in the disclosure means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect. The words such as "inner", "outer", "up", "down" are only used to represent the relative position relationship. When the absolute position of a described object changes, the relative position relationship may also change accordingly.

It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Figure 1:
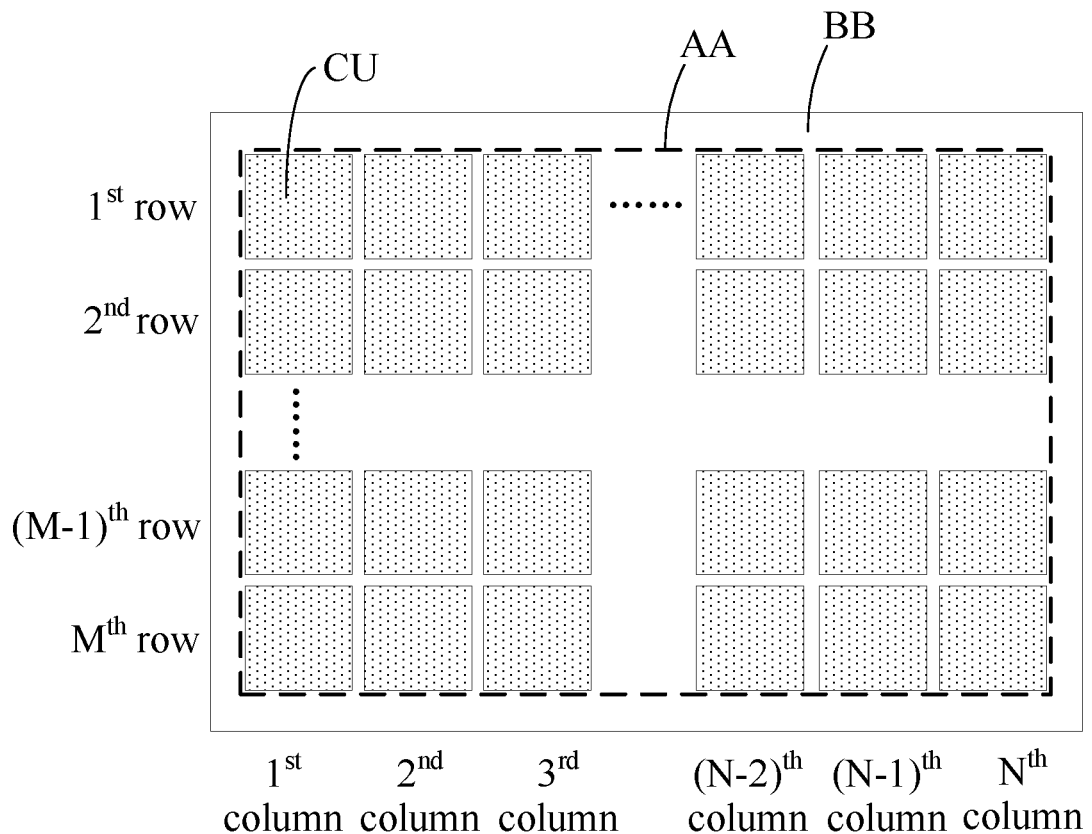
FIG. 1 is a schematic diagram of a planar structure of a light-emitting substrate according to an embodiment of the disclosure.
Figure 2:
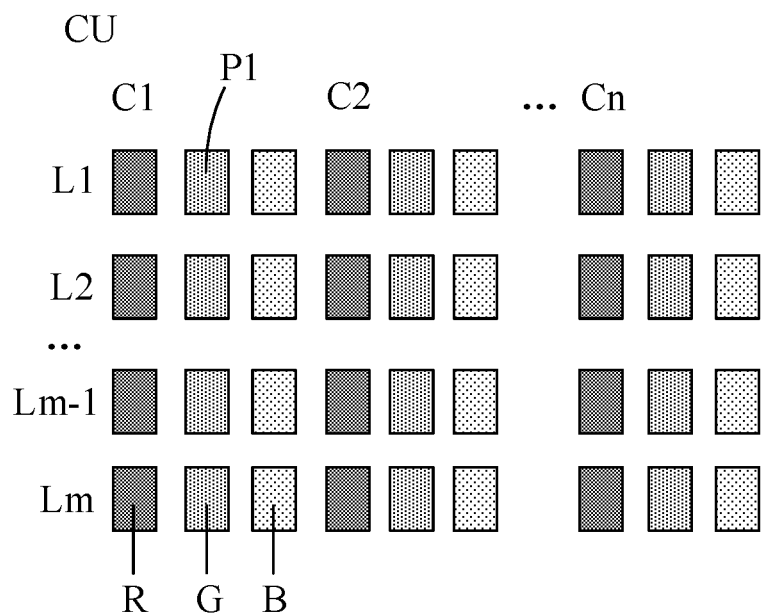
FIG. 2 is a schematic diagram of a planar structure of a light-emitting control unit in FIG. 1.
Figure 3:
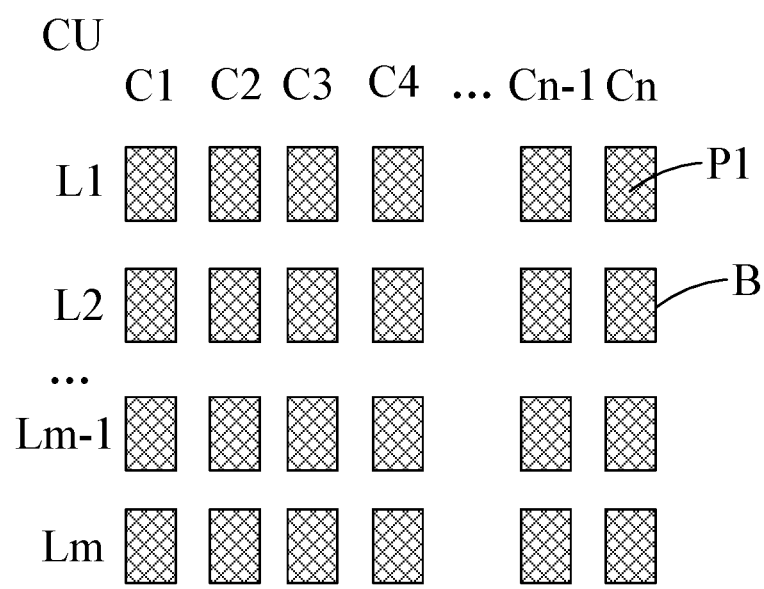
FIG. 3 is a schematic diagram of another planar structure of a light-emitting control unit in FIG. 1.
Figure 4:
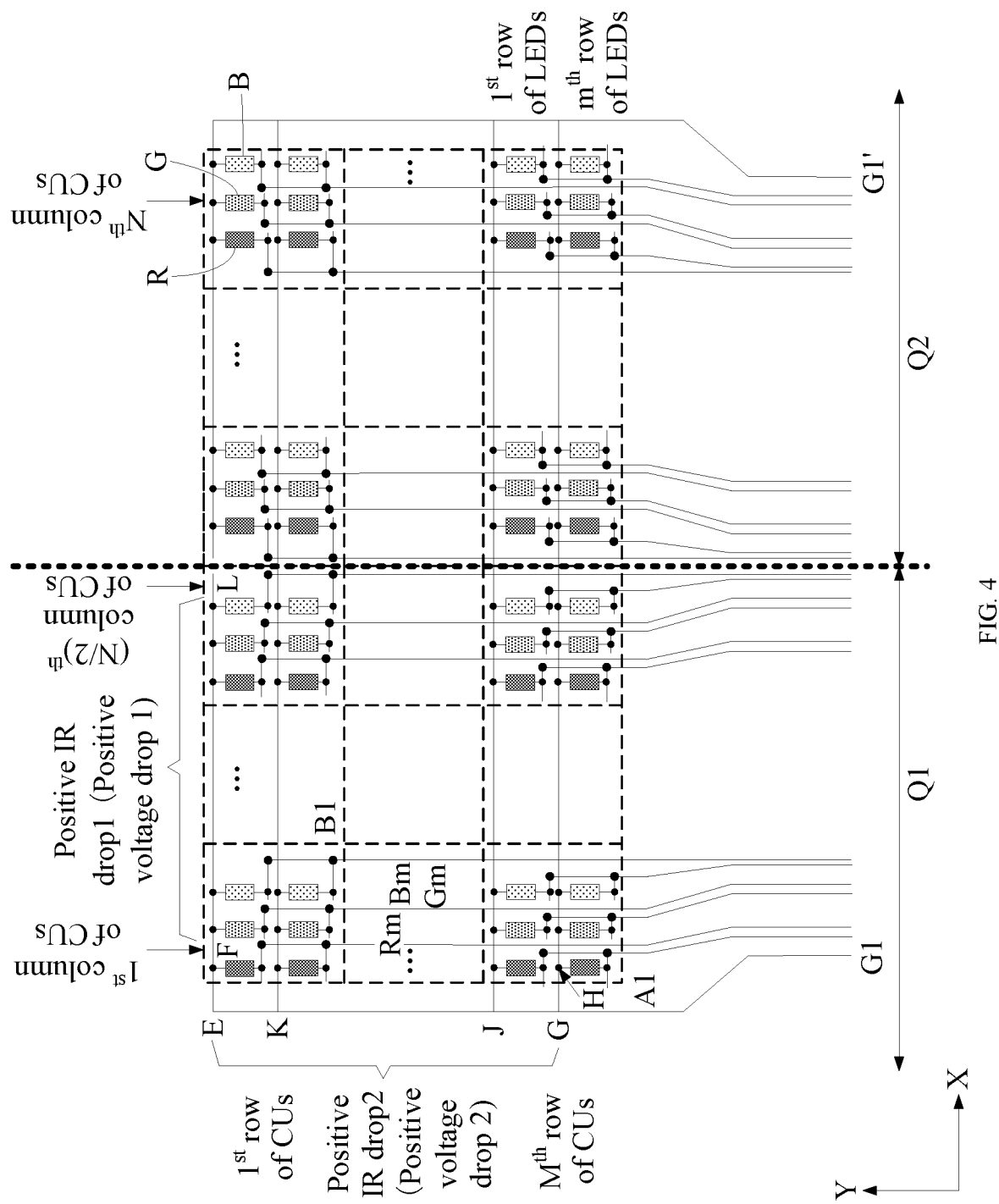
FIG. 4 is a schematic diagram of a planar structure of another light-emitting substrate according to an embodiment of the disclosure.
Figure 5:
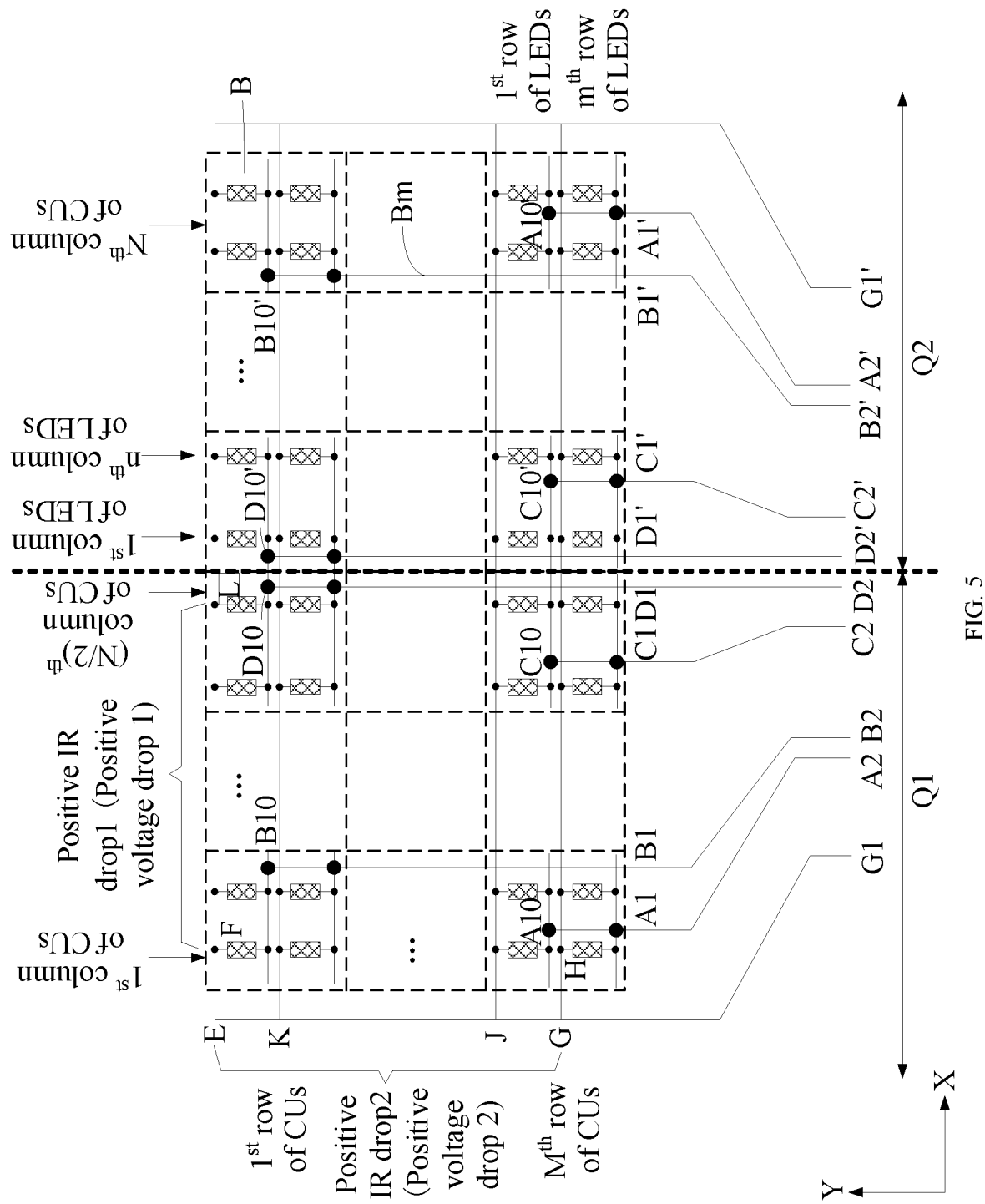
FIG. 5 is a schematic diagram of a planar structure of another light-emitting substrate according to an embodiment of the disclosure.

An embodiment of the disclosure provides a light-emitting substrate. As shown in FIG. 1, the light-emitting substrate has a light-emitting area AA and a peripheral area BB arranged around the light-emitting area AA. The light-emitting substrate specifically includes:

a plurality of light-emitting control units CU (lamp areas) distributed in an array in the light-emitting area AA, where FIG. 1 takes M (row)*N (column) lamp areas as an example; as shown in FIG. 2 and FIG. 3, which are respectively schematic structural diagrams of one light-emitting control unit CU, each light-emitting control unit CU includes at least one sub-light-emitting unit P1, and for example, each light-emitting control unit CU includes a plurality of sub-light-emitting units P1 distributed in an array in the embodiment of the disclosure; as shown in FIG. 4 and FIG. 5, the plurality of light-emitting control units CU are divided into at least two areas, and for example, the plurality of light-emitting control units CU are divided into two areas Q1 and Q2 in FIG. 4 and FIG. 5 of the embodiment of the disclosure; and at least two positive voltage lines (G1 and G1') located in the peripheral area BB and respectively located on opposite sides of the plurality of light-emitting control units CU; wherein sub-light-emitting units of light-emitting control units in a same area are electrically connected to a same positive voltage line, and sub-light-emitting units of light-emitting control units in different areas are electrically connected to different positive voltage lines; for example, the sub-light-emitting units P1 of the light-emitting control units CU in the area Q1 are electrically connected to the same positive voltage line G1, and the sub-light-emitting units P1 of the light-emitting control units CU in the area Q2 are electrically connected to the same positive voltage line G1'.

In the above light-emitting substrate according to the embodiment of the disclosure, the plurality of light-emitting control units are divided into at least two areas, and a different positive voltage line is used in each area to apply a positive voltage to the light-emitting control units in the corresponding area, so that the number of sub-light-emitting units driven by each positive voltage line is at least halved, which can effectively reduce the positive IR drop caused by the positive voltage line between the sub-light-emitting units, so that the positive voltage difference between the sub-light-emitting units is greatly reduced, thereby improving the uniformity of luminous brightness of each area of the light-emitting substrate.

In a specific implementation, in the above light-emitting substrate according to the embodiment of the disclosure, the sub-light-emitting unit may be an inorganic light-emitting diode with a size of one hundred microns or less, wherein the inorganic light-emitting diode with a size of one hundred microns or less may be a mini LED or a micro LED. The size range of the mini LED is about 100 μm to 600 μm, and the size of the micro LED is less than 100 μm.

In a specific implementation, the light-emitting substrate according to the embodiment of the disclosure may be configured to display or provide backlight.

Figure 6:
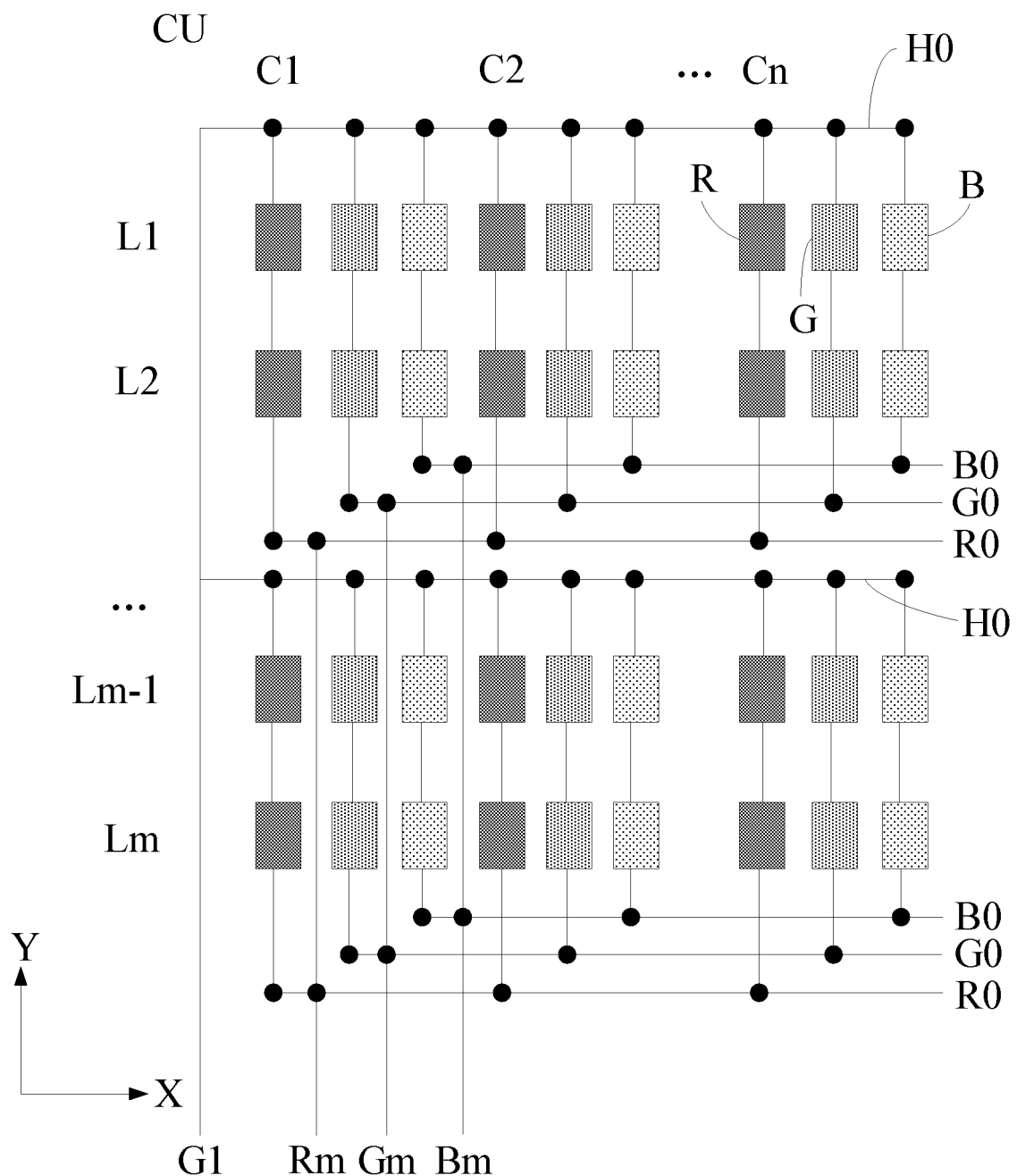
FIG. 6 is a schematic diagram of another planar structure of a light-emitting control unit in FIG. 1.

In a specific implementation, in the above light-emitting substrate according to the embodiment of the disclosure, as shown in FIGS. 2, 4 and 6, each light-emitting control unit CU may include a plurality of sub-light-emitting units (R-LED, G-LED, B-LED) with different light-emitting colors distributed in an array, and for example, the numbers of R-LEDs, G-LEDs and B-LEDs are respectively m (row)*n (column); wherein the sub-light-emitting units in a same column have a same light-emitting color, and the sub-light-emitting units of different light-emitting color columns are arranged alternately in a row direction. Specifically, the sub-light-emitting units may include a red sub-light-emitting unit, a green sub-light-emitting unit and a blue sub-light-emitting unit, that is, the light-emitting substrate uses RGB three primary color LEDs to directly mix light into the white light; of course, the sub-light-emitting units may also include sub-light-emitting units with other colors, such as white and yellow.

FIG. 6 is a schematic diagram of series-parallel connection of LEDs in each light-emitting control unit CU. Assuming that the number of connection lines H0 electrically connected to the positive voltage line G1 and extending in the row direction X in each light-emitting control unit CU is p, p connection lines H0 are connected outside or inside the light-emitting area AA; $1 \le p \le m$, p is a positive integer, and m/p is an integer; m/p LEDs among m sub-light-emitting units with the same light-emitting color in the same column (such as R-LEDs in the same column) are connected in series. As can be seen, the number of parallel LEDs with the same color in the same light-emitting control unit CU is m*n/p; each light-emitting control unit CU has p groups of horizontal negative connection lines (R0, G0, B0); the horizontal lines corresponding to the LEDs with the same color in the p groups of horizontal negative connection lines (R0, G0, B0) are connected to the vertical negative voltage line, for example, all R0 are electrically connected to the vertical negative voltage line Rm, all G0 are electrically connected to the vertical negative voltage line Gm, and all B0 are electrically connected to the vertical negative voltage line Bm. It can be seen that the number of negative voltage lines (Rm, Gm, Bm) included in each light-emitting control unit CU is at least the same as the number of light-emitting colors, that is, there are at least three vertical negative voltage lines (Rm, Gm, Bm) in each light-emitting control unit CU.

As shown in FIG. 6, in order to improve the yield rate of LEDs, the number of LEDs in series can be reduced accordingly. In the embodiment of the disclosure, every two adjacent LEDs in the same column are connected in series and then connected in parallel, thus reducing the total current of the light-emitting substrate. When the number of LEDs in each light-emitting control unit CU is determined, the greater the number of LEDs connected in series, the smaller the total current in the light-emitting control unit CU. However, when the number of LEDs connected in series increases, the total current of the light-emitting control unit CU is relatively small due to the fact that the current of each LED is small. This may make it difficult to drive the light-emitting circuit. Compared with the light-emitting substrate in which all LEDs of the same color are connected in series, the light-emitting substrate adopts a combination of series connection and parallel connection, ensuring that the LEDs can be driven to emit light while reducing the power consumption.

During specific implementation, in an embodiment of the disclosure, it is assumed that all LEDs in the light-emitting control unit CU shown in FIG. 6 are connected in parallel, where p=m, that is, each row of LEDs are electrically connected to a positive voltage line.

Figure 7:
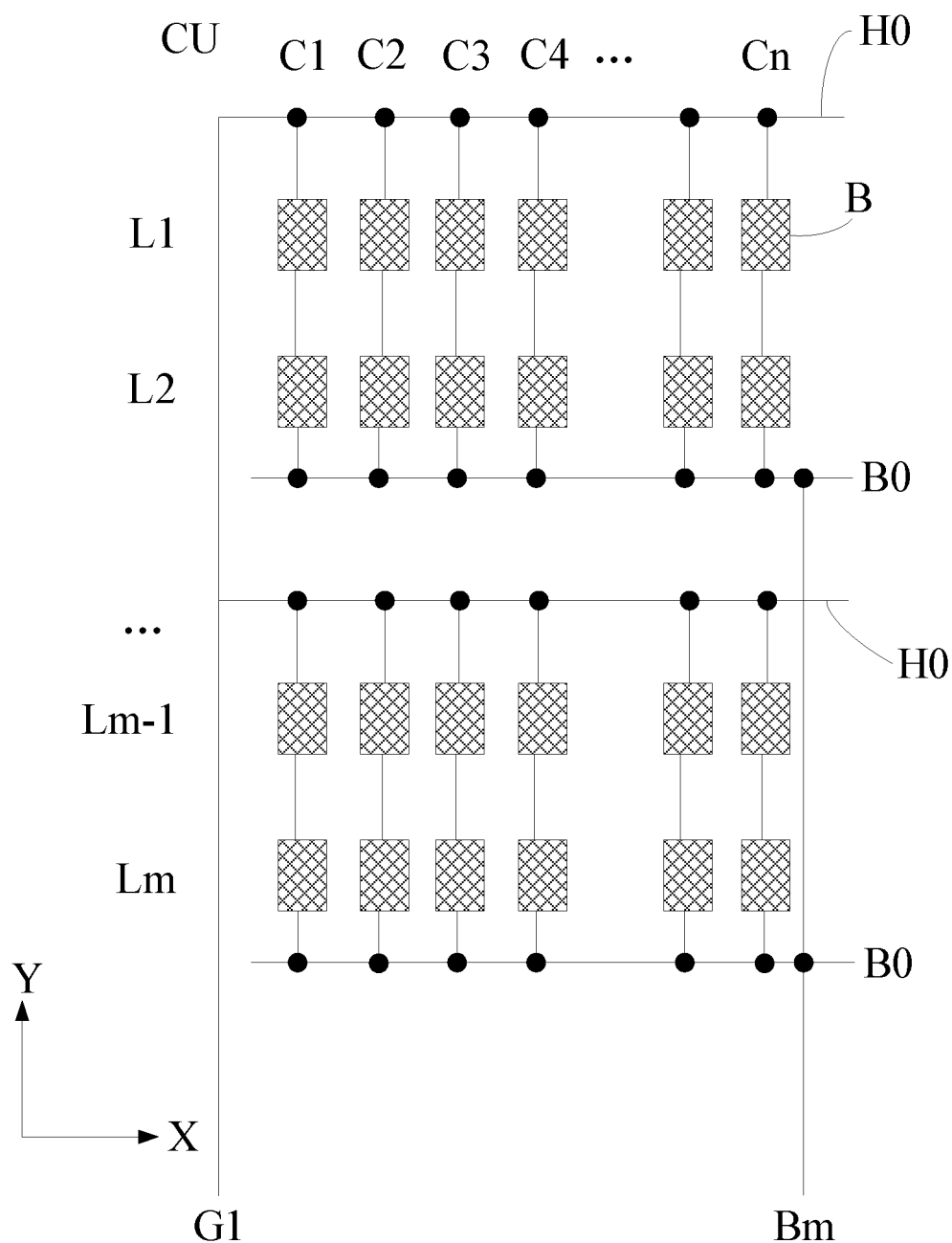
FIG. 7 is a schematic diagram of another planar structure of a light-emitting control unit in FIG. 1.

During specific implementation, in the above light-emitting substrate according to the embodiment of the disclosure, as shown in FIGS. 3, 5 and 7, each light-emitting control unit CU may include m (row)*n (column) sub-light-emitting units with the same light-emitting color (such as blue sub-light-emitting units B-LEDs) distributed in an array, that is, the light-emitting substrate can use the blue LEDs in cooperation with phosphors (or quantum dot materials) to mix light into the white light. In each light-emitting control unit CU, the number of connection lines H0 electrically connected to the positive voltage line G1 and extending in the row direction X is p, where 1≤p≤m, p is a positive integer, and m/p is an integer; m/p B-LEDs among m sub-light-emitting units (B-LEDs) in the same column are connected in series. As can be seen, the number of parallel LEDs with the same color in the same light-emitting control unit CU is m*n/p; each light-emitting control unit CU has p groups of horizontal negative connection lines (B0); the p horizontal lines corresponding to the LEDs in the p groups of horizontal negative connection lines (B0) are connected to the vertical negative voltage line Bm, for example, all B0 are electrically connected to the vertical negative voltage line Bm. It can be seen that at least one negative voltage line Bm is included in each light-emitting control unit CU.

During specific implementation, the number of LEDs connected in series in each column can be designed as needed.

During specific implementation, in the above light-emitting substrate according to the embodiment of the disclosure, as shown in FIGS. 4 and 5, taking M(row)*N(column) light-emitting control units CU distributed in an array as an example, the plurality of light-emitting control units CU are divided into two areas (Q1 and Q2) in the row direction X, the number of the positive voltage lines (G1 and G1') is two, and the two positive voltage lines (G1 and G1') are symmetrically arranged about a center of the light-emitting area AA. In this way, M (row)*N/2 (column) light-emitting control units CU included in the left area Q1 share the positive voltage line G1, and M (row)*N/2 (column) light-emitting control units CU included in the right area Q2 share another positive voltage line G2, achieving the higher uniformity of luminous brightness of the light-emitting substrate.

Specifically, taking the light-emitting substrate shown in FIG. 5 as an example, FIG. 5 is a schematic diagram of an implementation method for the light-emitting substrate of the embodiment of the disclosure to achieve the higher uniformity of luminous brightness. It is necessary to calculate the voltage difference between the positive and negative poles of the LEDs in the light-emitting control unit CU at different positions; the negative voltage line inside the light-emitting control unit CU can adopt a mesh design, the IR drop on the negative voltage line between the LEDs inside the light-emitting control unit CU is ignored in the embodiment of the disclosure. It can be found that, in the area Q1, there is a maximum voltage drop IR drop_max between the last LED in the first column from the left of the light-emitting control units CU in the $M^{th}$ row (that is, the LED at the lower left corner) and the first LED in the last column from the left of the light-emitting control units CU in the first row (that is, the LED at the upper right corner in the area Q1); in order to ensure the uniformity of brightness between the two LEDs, it is necessary to ensure that IR drop_max is less than IR drop_spec (standard value); where the IR drops (positive IR drop1+positive IR drop2) between the two LEDs are classified for calculation.

(1) Positive IR Drop1

Here, the voltage difference between the positive pole of the LED in the lower left corner and the positive pole of the LED in the upper right corner in the area Q1 is defined as the positive IR drop1; and it can be found that the IR drop between EF and GH can be eliminated; and the IR drop between FLs is the positive IR drop1. It is assumed that the maximum current of a single LED is I0 in the case where the light-emitting substrate realizes the maximum required brightness L; and it can be found that the positive current between FLs decreases from (n*N/2−1)I0 to I0 sequentially along the current direction. Therefore, the positive IR drop1=I0*Rp*(n*N/2−1)*n*N/4; where Rp is the resistance of the positive voltage line G1 between two LEDs in the positive direction; and Rp=◇*Px/Wp; wherein ◇ is the square resistance of the metal material corresponding to the positive voltage line G1, Px is the spacing between adjacent LEDs in the row direction X, and Wp is the line width of the positive pole. Here, n*N/2 is the number of LEDs driven by the positive voltage line G1. Since the light-emitting area AA is driven bilaterally by two positive voltage lines G1 and G1', the number of LEDs driven by each positive voltage line is halved, and correspondingly the positive IR drop1 is significantly reduced.

(2) Positive IR Drop2

Here, the voltage drop of the positive voltage line G1 around LEDs in the area Q1 is defined as the positive IR drop2, and the total current of the positive poles of the LEDs is equal to I0*m*n*M*N/2; and the total current of the positive poles of the LEDs is transmitted through points G1 to G. Each time the total current passes through a row of LEDs, the total current will be shunted outward by I0*n*N/2. It can be found that the currents on the positive poles of the LEDs decrease gradually along the current direction (from bottom to top). It can be found that the positive IR drop2 is the sum of multiple voltage drops. As shown in FIG. 5, the first IR drop corresponding to the segment GJ of the peripheral positive voltage line is equal to $R0*I0*(m*M-1)*n*N/2$, where $R0$ is the resistance corresponding to the segment GJ of the peripheral positive voltage line; and by analogy, the $(m*M-1)^{th}$ IR drop corresponding to the segment KE of the peripheral positive voltage line is equal to $R0*I0*n*N/2$. The sum of the voltage drops of the $m*M-1$ segments is $R0*I0*n*N/2*(1+ \ldots +M*m-1)=R0*I0*n*N/2*(M*m-1)*M*m/2$; where the voltage drop IR drop2 of this part can be effectively reduced by adjusting the width of the peripheral positive voltage line (that is, adjusting $R0$).

Therefore, since the IR drop1 and IR drop2 between the two LEDs with the maximum voltage drop IR drop_max in the area Q1 are reduced, the IR drop between any other two LEDs will also be reduced, so that the luminous brightness of the LEDs in the entire area Q1 is more uniform. The principle of reducing the IR drop in the area Q2 is the same as the principle of reducing the IR drop in the area Q1, and will not be repeated herein.

It should be noted that the embodiment of the disclosure takes the positive voltage lines G1 and G2 independent from each other as an example. Of course, the positive voltage lines G1 and G2 can also be merged (that is, electrically connected) from the center line of the light-emitting substrate, which means that the positive voltage is applied to the sub-light-emitting units in the same row simultaneously from both ends of the positive voltage line G1 and G2.

Figure 8:
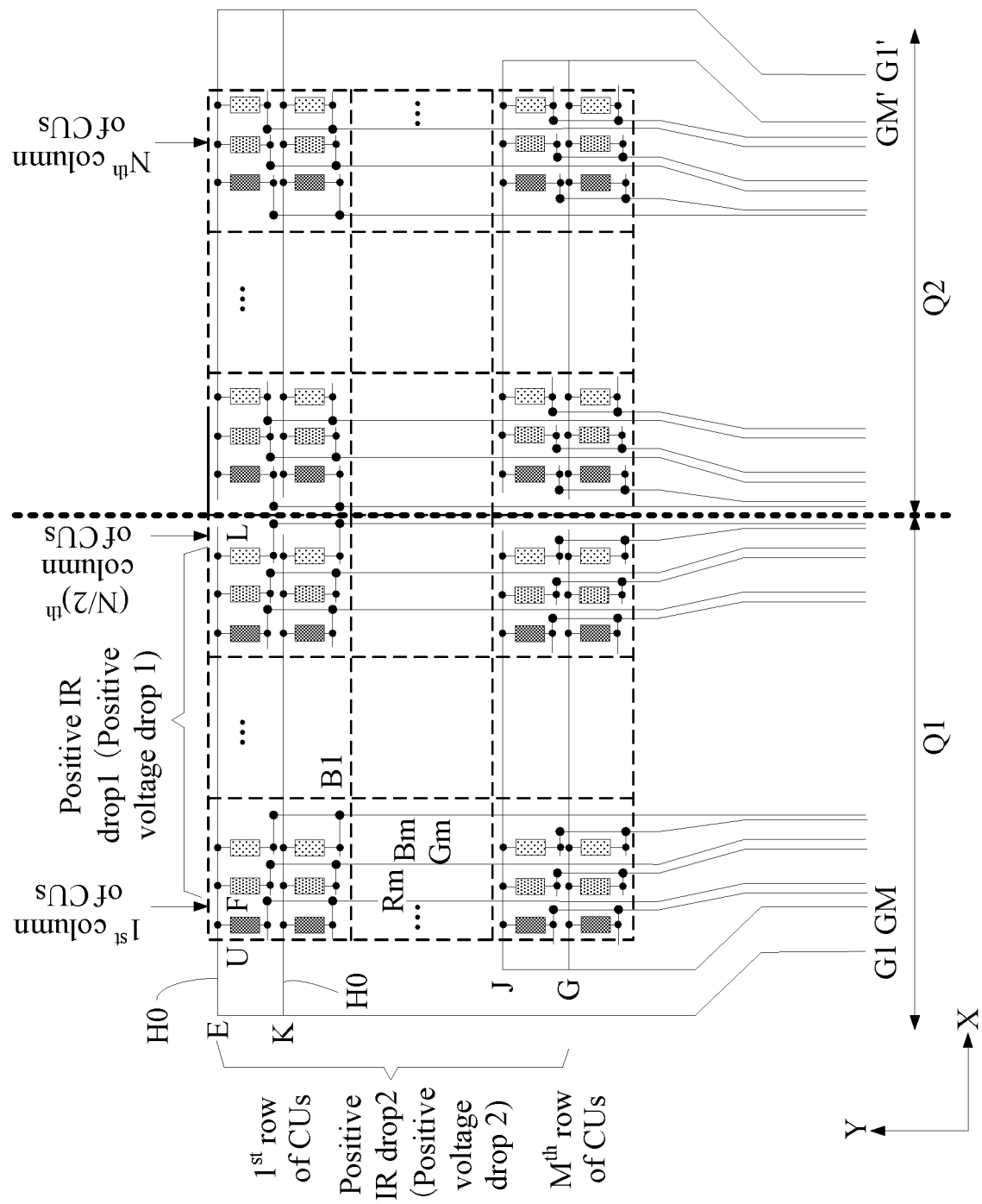
FIG. 8 is a schematic diagram of a planar structure of another light-emitting substrate according to an embodiment of the disclosure.
Figure 9:
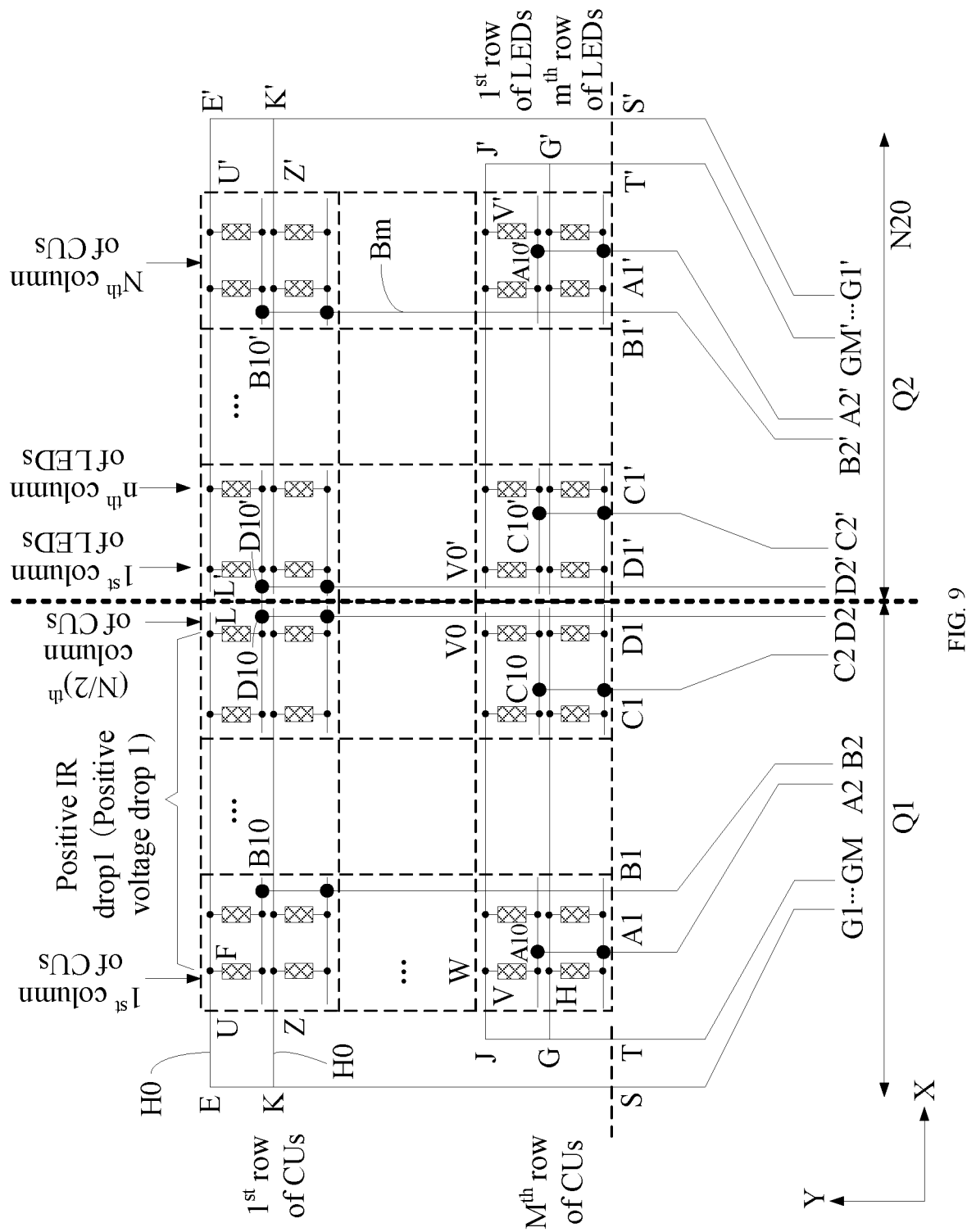
FIG. 9 is a schematic diagram of a planar structure of another light-emitting substrate according to an embodiment of the disclosure.

During specific implementation, in the above light-emitting substrate according to the embodiment of the disclosure, as shown in FIG. 8 and FIG. 9, the light-emitting control units CU in each area (for example, Q1) are divided into at least two sub-areas (for example, each row of light-emitting control units CU in the area Q1 is a sub-area) in the column direction Y, the sub-light-emitting control units of the light-emitting control units in a same sub-area are electrically connected to a same positive voltage line, and the sub-light-emitting units of the light-emitting control units in different sub-areas are electrically connected to different positive voltage lines. For example, in the area Q1, the sub-light-emitting units P1 of the first row of light-emitting control units CU are electrically connected to the positive voltage line G1, . . . , the sub-light-emitting units P1 of the last row of light-emitting control units CU are connected to the positive voltage line GM; and for example, in the area Q2, the sub-light-emitting units P1 of the first row of light-emitting control units CU are electrically connected to the positive voltage line G1', . . . , the sub-light-emitting units P1 of the last row of light-emitting control units CU are connected to the positive voltage line GM'.

The positive voltage lines corresponding to the light-emitting control units in each area extend in the column direction and are arranged in the row direction, and each positive voltage line extends to a lead area of the peripheral area. For example, the positive voltage lines (G1 . . . GM) corresponding to the light-emitting control units CU in the area Q1 extend in the column direction Y and are arranged in the row direction X, and the positive voltage lines (G1 . . . GM) extend to the lead area of the peripheral area BB.

The positive voltage lines (G1 . . . GM) have the same resistance value, so that the positive IR drop 2 corresponding to each sub-area can be eliminated, and the positive IR drop corresponding to each sub-area can be reduced accordingly, thereby further improving the uniformity of the luminous brightness of the light-emitting substrate.

Specifically, taking the light-emitting substrate shown in FIG. 9 as an example, FIG. 9 is a schematic diagram of another implementation method for the light-emitting substrate of the embodiment of the disclosure to achieve the higher uniformity of luminous brightness. Different from the case where each area (such as Q1) shares the same positive voltage line G1 shown in FIG. 5, as shown in FIG. 9, one row of lamp areas or multiple rows of lamp areas share the same positive pole; and particularly, as shown in FIG. 9, each row of light-emitting control units CU is electrically connected to the respective independent positive voltage line (G1 . . . GM), that is, there are M positive voltage lines (G1 . . . GM) in the area Q1, and there are M positive voltage lines (G1' . . . GM') in the area Q2. In the manner shown in FIG. 9, the positive IR drop1 is the same as the positive IR drop1 shown in FIG. 5, and will not be repeated herein. The positive IR drop2 shown in FIG. 9 is the voltage drop between each positive voltage input terminal and the respective horizontal positive intersection, that is, the voltage drop of G1_K, . . . , GM_G in FIG. 9. As shown in FIG. 9, each positive current is significantly reduced at this time. For example, when each row of light-emitting control units CU corresponds to an independent positive voltage line and the positive voltage line is driven bilaterally, the maximum positive current=$I0*m*n*N/2$. Taking G1_K as an example, the positive current is transmitted from G1 to point K, and the IR drop2 from G1 to point K is equal to $I0*m*n*N/2*Rp\_G1K$, where Rp_G1K is the resistance between the positive voltage transmission terminal G1 corresponding to the first row of light-emitting control units CU and the point K; and similarly, the positive IR drop2 corresponding to the $M^{th}$ row of light-emitting control units CU is equal to $I0*m*n*N/2*Rp\_GMG$, where Rp_GMG is the resistance between the positive voltage transmission terminal GM corresponding to the $M^{th}$ row of light-emitting control units CU and the point G. It can be found that the difference in the positive IR drop2 corresponding to each row of light-emitting control units CU is caused by the resistance of each positive voltage line. When the equal resistance wiring is used for each positive voltage line (G1 . . . GM), that is, $Rp\_G1K=, \ldots, =Rp\_GMG$, each positive IR drop2 is equal. At this time, compared with the positive connection manner shown in FIG. 5, the positive IR drop2 shown in FIG. 9 can be eliminated.

Figure 10A:
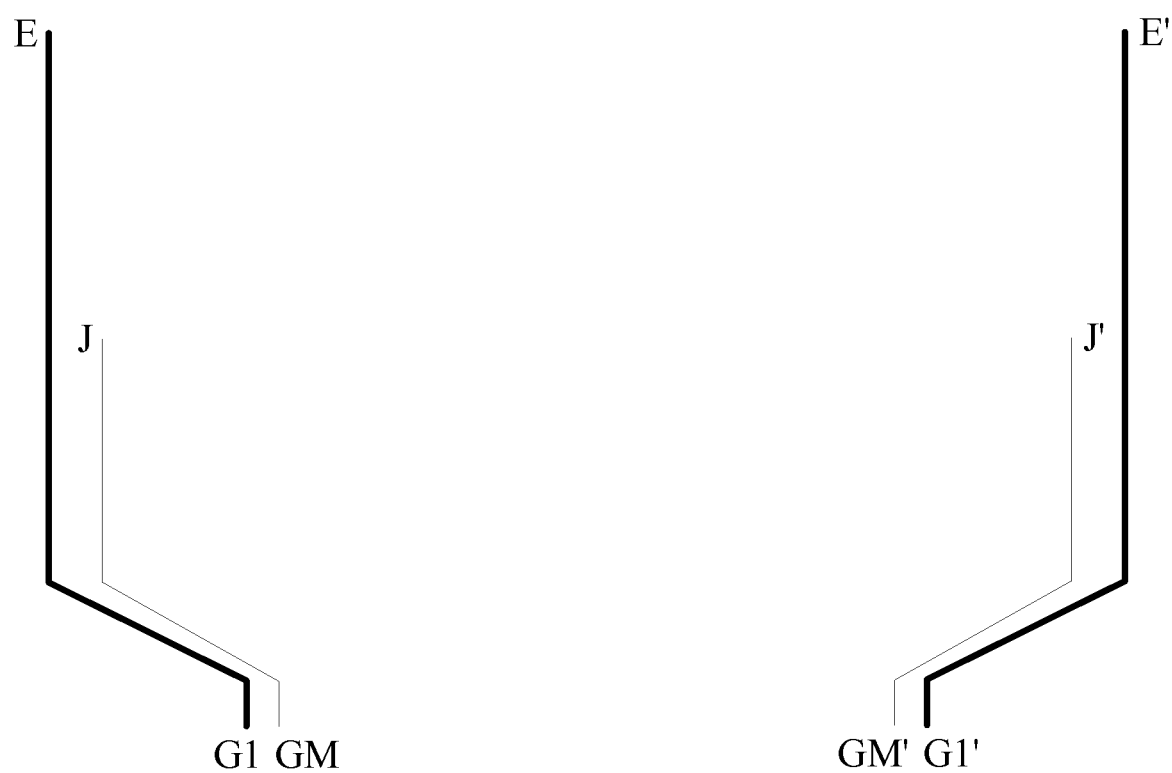
FIGS. 10A-10D are schematic diagrams of several structures for reducing the IR drop of the positive pole according to the embodiments of the disclosure.

In a specific implementation, in the above light-emitting substrate according to the embodiment of the disclosure, as shown in FIG. 9, the length of the positive voltage line G1 corresponding to the first row of light-emitting control units CU is significantly greater than the length of the positive voltage line GM corresponding to the $M^{th}$ row of light-emitting control units CU. Therefore, in order to realize the resistance wiring of the positive voltage lines (G1 . . . GM), the widths of the positive voltage lines (G1 . . . GM) can be reduced sequentially in the direction where the lengths of the positive voltage lines (G1 . . . GM) are from large to small in each area (e.g., Q1), that is, the width of the segment G1_E needs to be greater than that of the segment GM_J, as shown in FIG. 10A, which shows separately that the width of the segment G1_E is greater than that of the segment GM_J. Similarly, the widths of the positive voltage lines (G1' . . . GM') can be reduced sequentially in the direction where the lengths of the positive voltage lines (G1' . . . GM') are from large to small in the area Q2, that is, the width of the segment G1'_E' needs to be greater than that of the segment GM'_J', as shown in FIG. 10A, which also shows that the width of the segment G1'_E' is greater than that of the segment GM'_J'.

Figure 10B:

In a specific implementation, in the above light-emitting substrate according to the embodiment of the disclosure, as shown in FIG. 9, the length of the positive voltage line G1 corresponding to the first row of light-emitting control units CU is significantly greater than the length of the positive voltage line GM corresponding to the M$^{th}$ row of light-emitting control units CU. Therefore, in order to realize the resistance wiring of the positive voltage lines (G1 . . . GM), the positive voltage lines (G1 . . . GM, G1' . . . GM') can be the same in length and width; wherein the positive voltage line (G1, G1') with the longest linear distance in the column direction Y is a straight line, and each positive voltage line (GM, GM') with a shorter linear distance in the column direction Y may be a broken line, as shown in FIG. 10B, which separately shows the shapes of G1, GM, G1' and GM'. Of course, each positive voltage line (such as GM, GM') with a short linear distance in the column direction Y may also be a curve.

In a specific implementation, in the above light-emitting substrate according to the embodiment of the disclosure, as shown in FIG. 9, the length of the positive voltage line G1 corresponding to the first row of light-emitting control units CU is significantly greater than the length of the positive voltage line GM corresponding to the M$^{th}$ row of light-emitting control units CU. Therefore, in order to realize the resistance wiring of the positive voltage lines (G1 . . . GM), each positive voltage line (e.g., G1) includes a first end (G1) in the lead area and a second end (E) away from the lead area; the bottom edge of the last row of light-emitting control units CU in each area (e.g., Q1) is a first horizontal reference line ST, and the first parts (S_G1 and T_GM) of the positive voltage lines (e.g., G1 and GM) between the first horizontal reference line ST and the first end (G1) are the same in length and width, that is, the segment S_G1 and the segment T_GM can be set to be the same in length and width.

The top edge of the last row of sub-light-emitting units among the light-emitting control units (for example) in each sub-area is a second horizontal reference line (e.g., the horizontal line where KZ and GH are located), and the second parts of the positive voltage lines between respective second horizontal reference lines and respective second ends are the same in length and width. For example, the second part (segment EK) of the positive voltage line G1 between the second horizontal reference line KZ and the second end E is the same in length and width as the second part (segment JG) of the positive voltage line GM between the second horizontal reference line GH and the second end J.

Figure 10C:
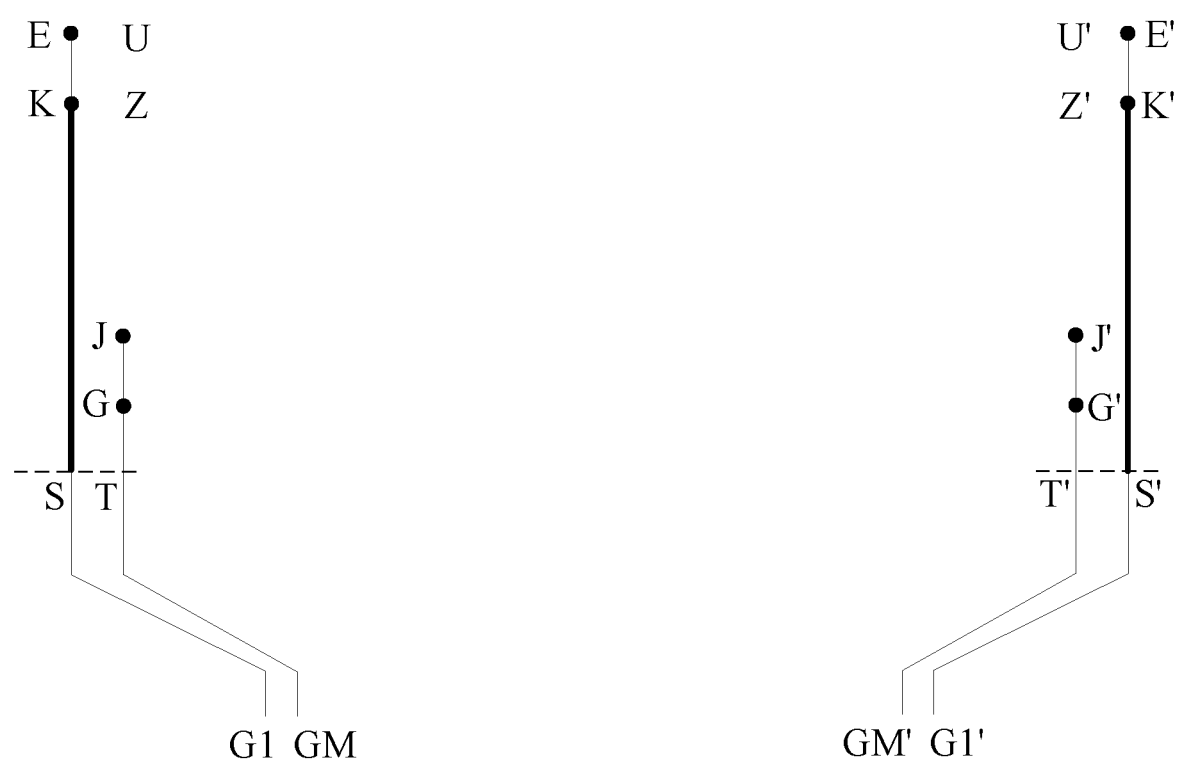
Figure 10D:
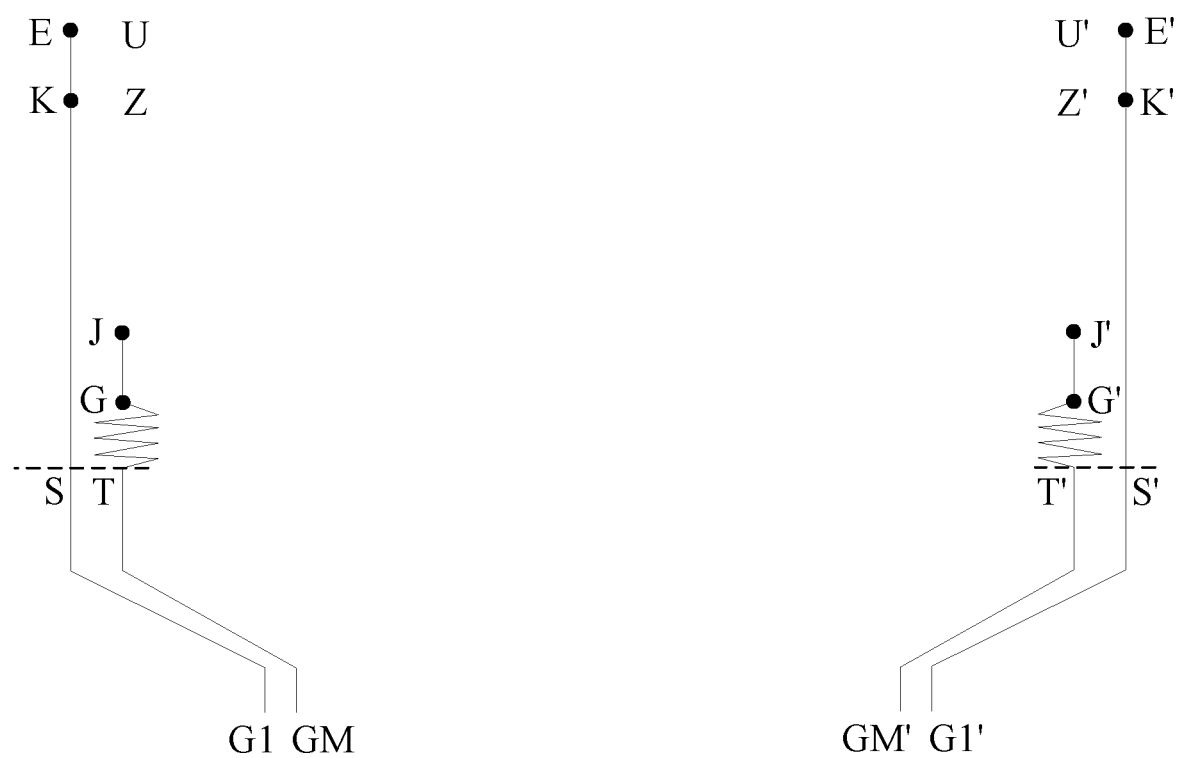

For a third part of each positive voltage line except the first part and the second part, the widths of the third parts decrease sequentially in the direction where the lengths of the third parts are from large to small, for example, the positive voltage line G1 has a third part (segment KS) except the first part (segment S_G1) and the second part (segment EK), the positive voltage line GM has a third part (segment GT) except the first part (segment T_GM) and the second part (segment JG), and the widths of the third parts (segment KS and segment GT) decrease sequentially in the direction where the lengths of the third parts (segment KS and segment GT) are from large to small, that is, the width of the segment KS is greater than the width of the segment GT, as shown in FIG. 10C, and similarly, the width of the segment K'S' is greater than the width of the segment G'T'; alternatively, as shown in FIG. 10D, the third parts (segment KS and segment GT) are the same in length and width, the third part (segment KS, segment K'S') with the longest linear distance in the column direction Y is a straight line, and each third part (e.g., segment GT, segment G'T') with a shorter linear distance in the column direction Y may be a broken line. Of course, each third part (e.g., segment GT, segment G'T') with a short linear distance in the column direction Y may also be a curve.

Furthermore, as can be seen from FIG. 9, the positive voltage line G1 of the first row of light-emitting control units CU is more peripheral than the positive voltage line GM of the M$^{th}$ row of light-emitting control units CU, that is, the lengths of EL, . . . , J_V0 are inconsistent, resulting in different resistances. Therefore, in order to realize the resistance wiring such as horizontal connection lines (EL, . . . , J_V0) electrically connected to the positive voltage lines, the above light-emitting substrate according to the embodiment of the disclosure, as shown in FIG. 9, further includes a plurality of connection lines H0 extending in the row direction X, where each positive voltage line (such as G1) is electrically connected to the sub-light-emitting unit through the corresponding connection line H0, and all the connection lines H0 have the same resistance value. Thus, except for the positive IR drop1, other positive IR drops of the light-emitting control units CU can be completely eliminated, to further improve the uniformity of the luminous brightness of the light-emitting substrate.

Specifically, as shown in FIG. 9, the light-emitting control units CU in each area (such as Q1, Q2) are divided into at least two sub-areas in the column direction Y (each row is a sub-area in the area Q1 and the area Q2 in the disclosure), the lengths of the connection lines electrically connected to all rows of LEDs in the same sub-area are the same, and the connection lines electrically connected to the light-emitting control units in each sub-area include first sub-connection lines located in the light-emitting area and second sub-connection lines located in the peripheral area. For example, the connection line H0 electrically connected to the first row of LEDs in the first row of light-emitting control units CU includes a first sub-connection line UL located in the light-emitting area AA and a second sub-connection line EU located in the peripheral area BB, and the connection line H0 electrically connected to the first row of LEDs in the M$^{th}$ row of light-emitting control units CU includes a first sub-connection line V_V0 located in the light-emitting area AA and a second sub-connection line JV located in the peripheral area BB. It can be seen that the length of the segment V_V0 is the same as the length of the segment UL, and the length of the segment EU is greater than the length of the segment JV; and in order to make the resistance value of the segment EL same as the resistance value of the segment J_V0, the resistance value of the segment EU must be equal to the resistance value of the segment JV.

Figure 11A:
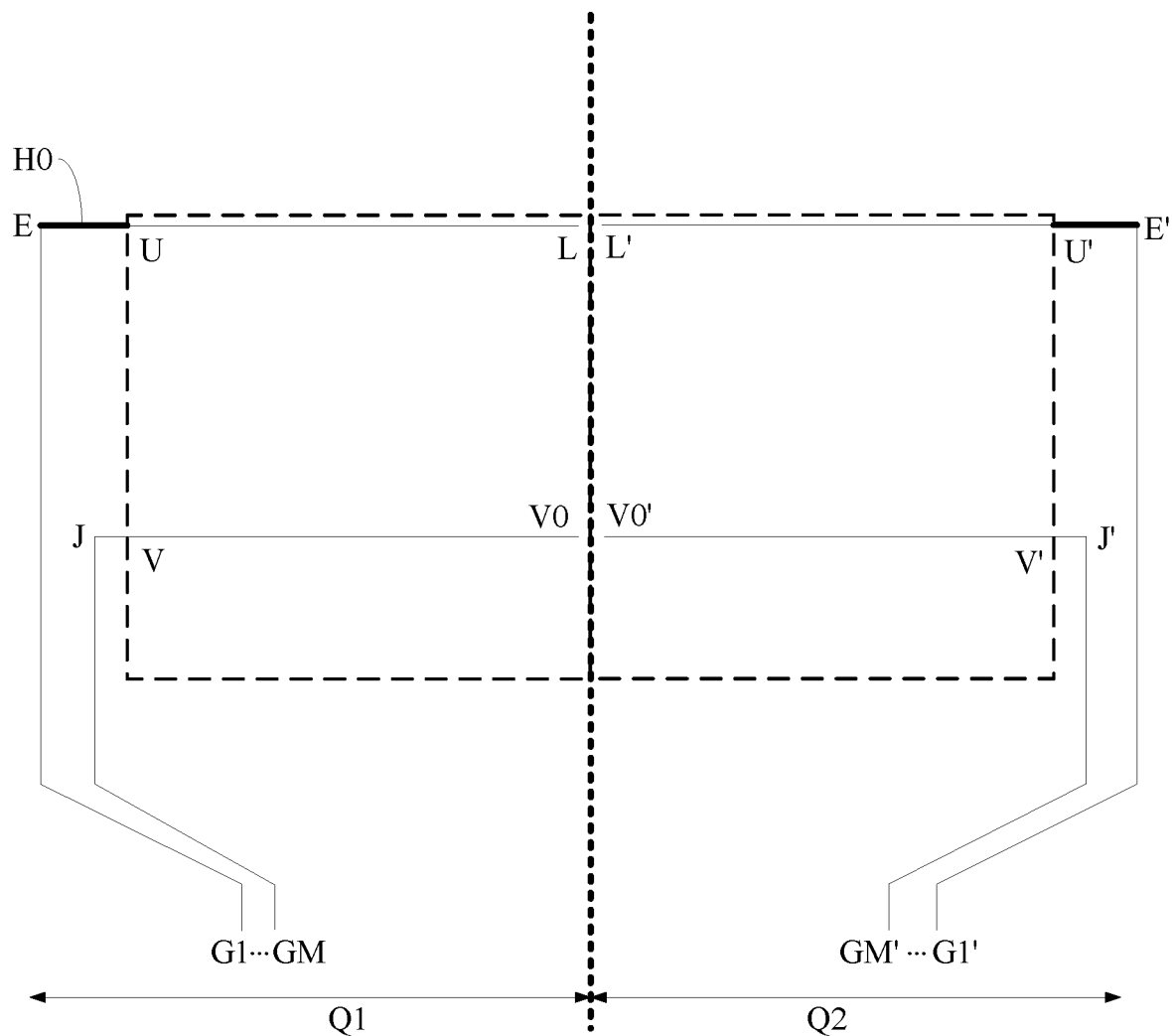
FIGS. 11A-11B are schematic diagrams of several structures for reducing the IR drop of the horizontal connection line according to the embodiments of the disclosure.

In one embodiment, as shown in FIG. 11A, FIG. 11A separately illustrates the segment EL, the segment E'L', the segment J_V0 and the segment J'_V0'. In the column direction Y, the lengths and widths of the second sub-connection lines (segment EU and segment JV) corresponding to the light-emitting control units CU in different sub-areas (such as the first row of light-emitting control units CU and the M$^{th}$ row of light-emitting control units CU) decrease sequentially, so that the resistance value of the segment EU is equal to the resistance value of the segment JV, that is, the resistance value of the segment EL is the same as the resistance value of the segment J_V0; and similarly, the lengths and widths of the segment E'U' and the segment J'V' decrease sequentially.

Figure 11B:
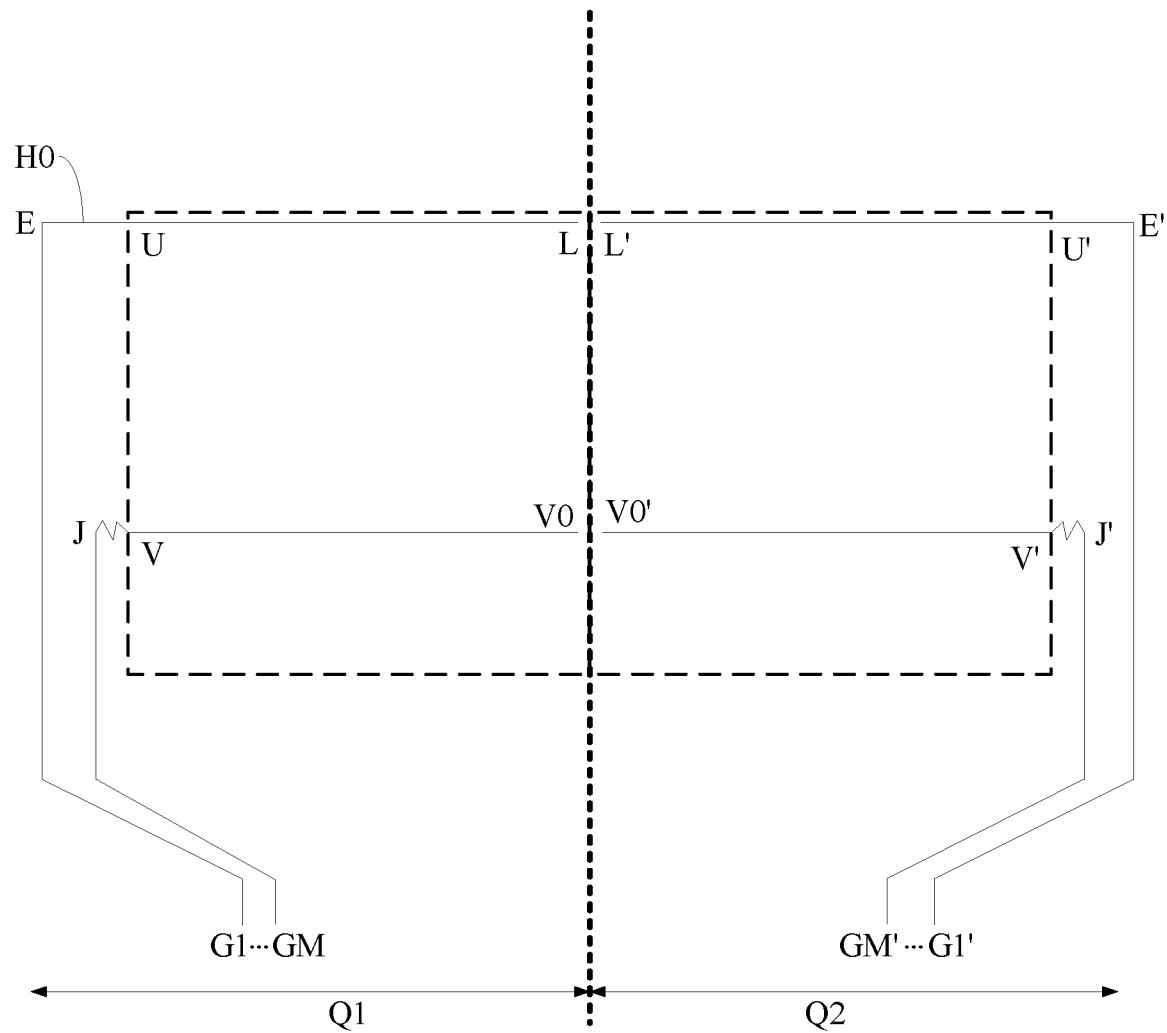

In another embodiment, as shown in FIG. 11B, FIG. 11B separately illustrates the segment EL, the segment E'L', the segment J_V0 and the segment J'_V0'. In the column direction Y, the second sub-connection lines (segment EU, segment JV, segment E'U', segment J'V') corresponding to the light-emitting control units CU in different sub-areas (such as the first row of light-emitting control units CU and the M$^{th}$ row of light-emitting control units CU) are the same in length and width, the second sub-connection line (EU, E'U') with the longest linear distance in the row direction X is a straight line, and each second sub-connection line (JV, J'V') with a shorter linear distance in the row direction X may be a broken line. Of course, each second sub-connection line (JV, J'V') with a shorter linear distance in the row direction X may also be a curve.

It should be noted that the arrangement of the positive voltage lines and the horizontal connection lines H0 in the structure shown in FIG. 8 is the same as that in FIG. 9, and will not be repeated herein.

It should be noted that FIG. 11A and FIG. 11B only illustrate the embodiment when the resistance values of the connection lines H0 in the row direction are the same. Of course, the structure of the positive voltage lines (G1 . . . GM) in the column direction in FIG. 11A and FIG. 11B may be any one of structures shown in FIGS. 10A to 10D.

Therefore, FIGS. 10A to 11B provided by the embodiments of the disclosure solve the problem of the positive IR drop of LEDs in the light-emitting area AA. Of course, the disclosure is not limited to the several implementations listed in the embodiments of the disclosure; and all implementations belong to the protection scope of the embodiments of the disclosure as long as the resistance values of the positive voltage lines and the connection lines are the same.

Taking FIG. 5 and FIG. 9 as an example, since each light-emitting control unit CU is electrically connected to at least one negative voltage line Bm, the lengths of the negative voltage lines Bm corresponding to the light-emitting control units CU in the same row are the same, but the lengths of the negative voltage lines Bm corresponding to the light-emitting control units CU in different rows are different. When the current is transmitted from the bottommost LED to the topmost LED in the light-emitting control units CU, the negative voltage lines Bm corresponding to the light-emitting control units CU in different rows will generate a negative IR drop, and the uniformity of the luminous brightness of the light-emitting substrate will deteriorate. Therefore, in order to implement the resistance wiring such as the negative voltage lines Bm corresponding to the light-emitting control units CU in different rows, the above light-emitting substrate according to the embodiment of the disclosure, as shown in FIG. 4 and FIG. 8, further includes a plurality of negative voltage lines (Rm, Gm, Bm), where each light-emitting control unit CU is electrically connected to at least three negative voltage lines (Rm, Gm, Bm), different light-emitting control units CU are electrically connected to different negative voltage lines (Rm, Gm, Bm), the negative voltage lines (Rm, Gm, Bm) are led out from the light-emitting area AA to the lead area of the peripheral area BB, and the negative voltage lines (Rm, Gm, Bm) have a same resistance value; as shown in FIG. 5 and FIG. 9, the light-emitting substrate further includes a plurality of negative voltage lines Bm, where each light-emitting control unit CU is electrically connected to at least one negative voltage line Bm, different light-emitting control units CU are electrically connected to different negative voltage lines Bm, the negative voltage lines Bm are led out from the light-emitting area AA to the lead area of the peripheral area BB, and the negative voltage lines Bm have a same resistance value. In this way, the negative IR drop of each light-emitting control unit CU can be eliminated, and the uniformity of the luminous brightness of the light-emitting substrate can be further improved.

In a specific implementation, in the above light-emitting substrate according to the embodiment of the disclosure, taking FIG. 5 and FIG. 9 as examples, each negative voltage line Bm includes a first sub-voltage line (A1_A10, B1_B10 . . . C1_C10, D1_D10, A1'_A10', B1'_B10' . . . C1'_C10', D1'_D10') located in the light-emitting area AA and a second sub-voltage line (A1_A2, B1_B2 . . . C1_C2, D1_D2, A1'_A2', B1'_B2' . . . C1'_C2', D1'_D2') located in the lead area, each first sub-voltage line (A1_A10, B1_B10 . . . C1_C10, D1_D10, A1'_A10', B1'_B10' . . . C1'_C10', D1'_D10') has a same resistance value, and each second sub-voltage line (A1_A2, B1_B2 . . . C1_C2, D1_D2, A1'_A2', B1'_B2' . . . C1'_C2', D1'_D2') has a same resistance value.

Figure 12A:
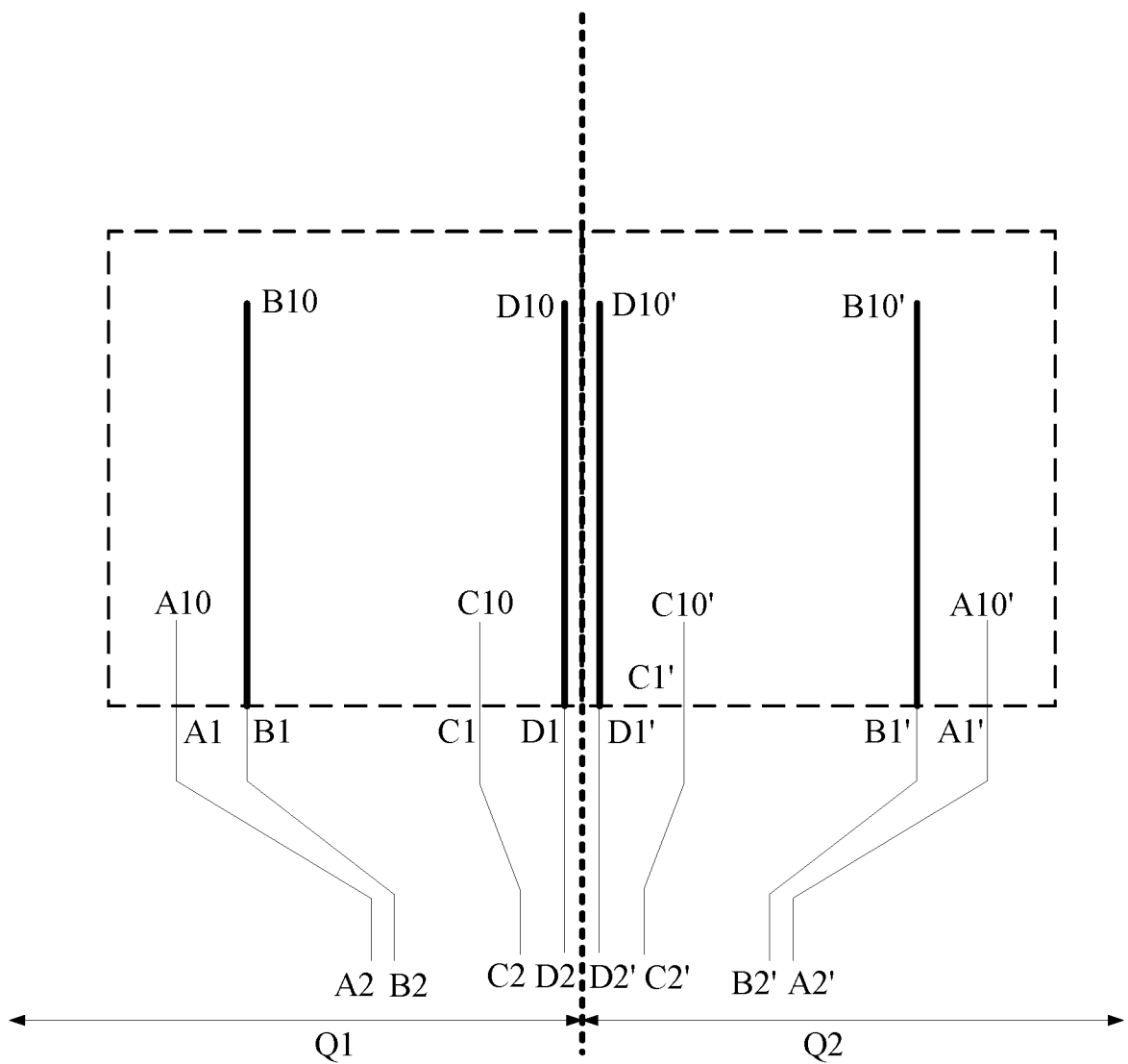
FIGS. 12A-12D are schematic diagrams of several structures for reducing the IR drop of the negative pole according to the embodiments of the disclosure.

In a specific implementation, in the above light-emitting substrate according to the embodiment of the disclosure, as shown in FIG. 12A which separately shows each negative voltage line Bm, the width of the first sub-voltage line (B1_B10, D1_D10, B1'_B10', D1'_D10') with a longer length is greater than the width of the first sub-voltage line (A1_A10, C1_C10, A1'_A10', C1'_C10') with a shorter length, so that each first sub-voltage line (A1_A10, B1_B10 . . . C1_C10, D1_D10, A1'_A10', B1'_B10' . . . C1'_C10', D1'_D10') has the same resistance value.

Figure 12B:
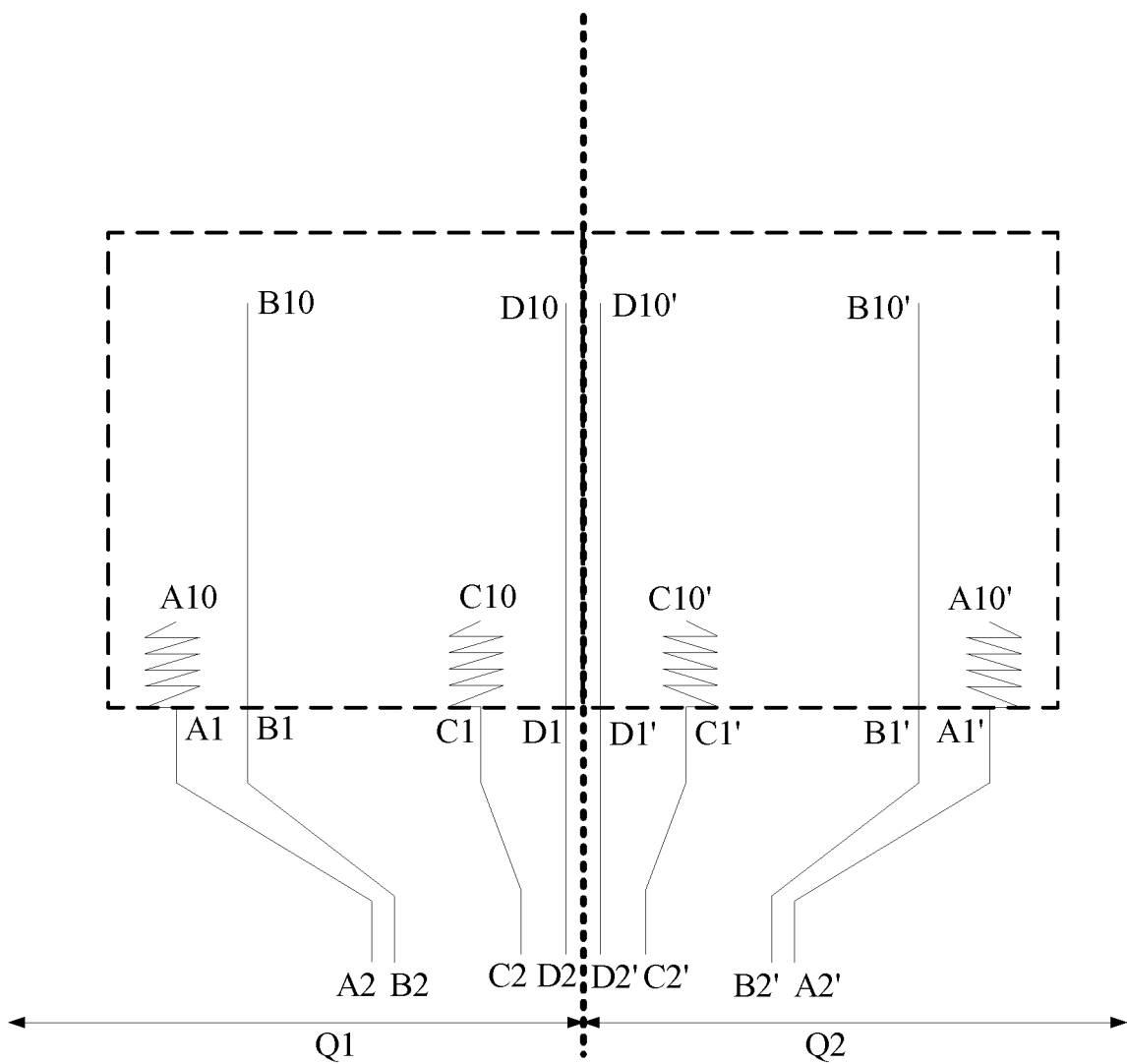

Alternatively, as shown in FIG. 12B, the first sub-voltage lines (A1_A10, B1_B10 . . . C1_C10, D1_D10, A1'_A10', B1'_B10' . . . C1'_C10', D1'_D10') are the same in length and width, wherein the first sub-voltage line (B1_B10, D1_D10, B1'_B10', D1'_D10') with the longest linear distance in the column direction Y is a straight line, and the first sub-voltage line (A1_A10, C1_C10, A1'_A10', C1'_C10') with a shorter linear distance in the column direction Y may be a broken line. Of course, the first sub-voltage line (A1_A10, C1_C10, A1'_A10', C1'_C10') with a short linear distance in the column direction Y may also be a curve.

Figure 12C:
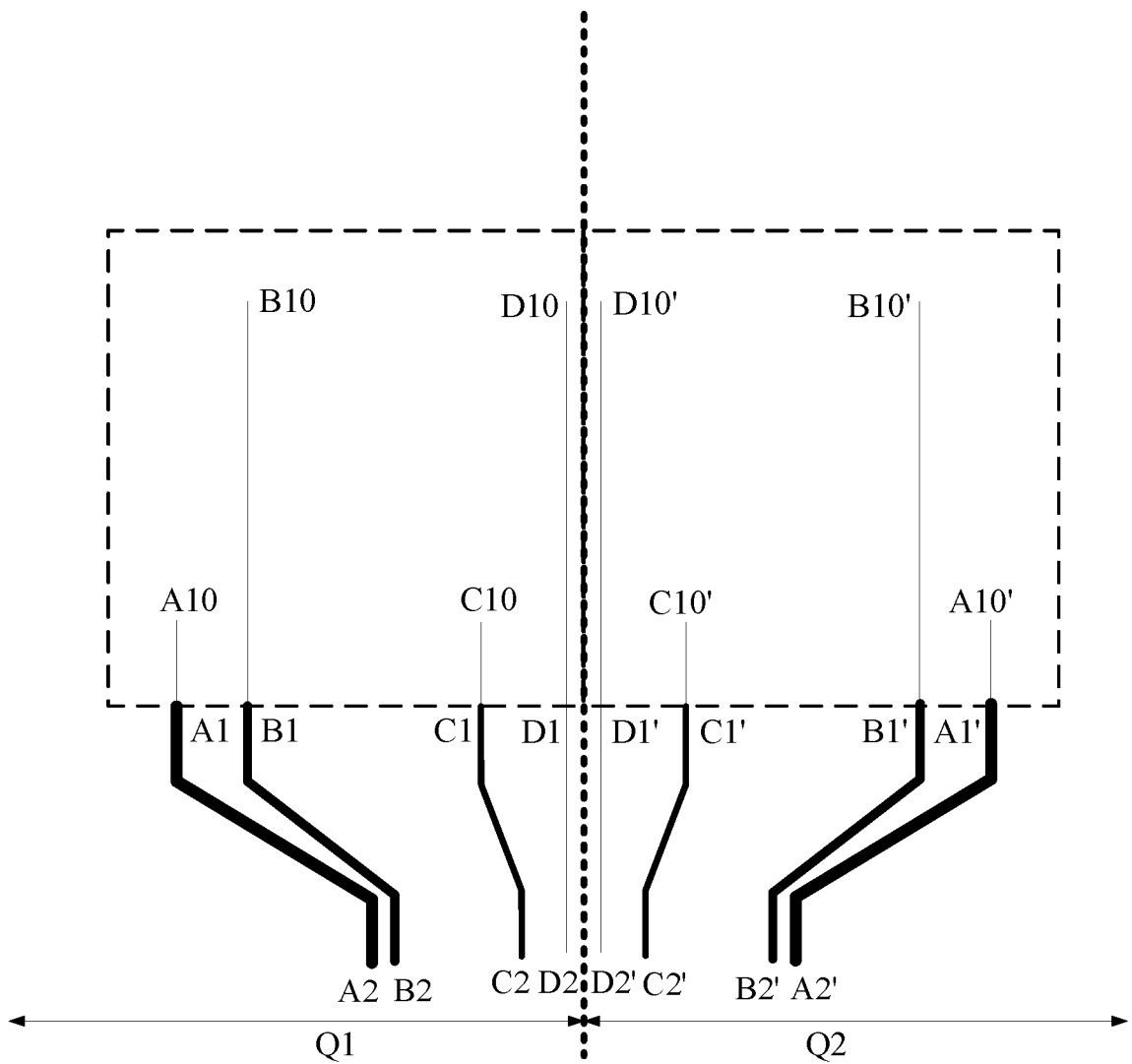

In a specific implementation, in the above light-emitting substrate according to the embodiment of the disclosure, as shown in FIG. 12C which separately shows each negative voltage line Bm, the width of the second sub-voltage line (A1_A2, B1_B2, C1_C2, A1'_A2', B1'_B2', C1'_C2') with a longer length is greater than the width of the second sub-voltage line (D1_D2, D1'_D2') with a shorter length; and the widths of A1_A2, B1_B2 and C1_C2 decrease sequentially, and the widths of A1'_A2', B1'_B2' and C1'_C2' decrease sequentially, so that each second sub-voltage line (A1_A2, B1_B2 . . . C1_C2, D1_D2, A1'_A2', B1'_B2' . . . C1'_C2', D1'_D2') has the same resistance value.

Figure 12D:
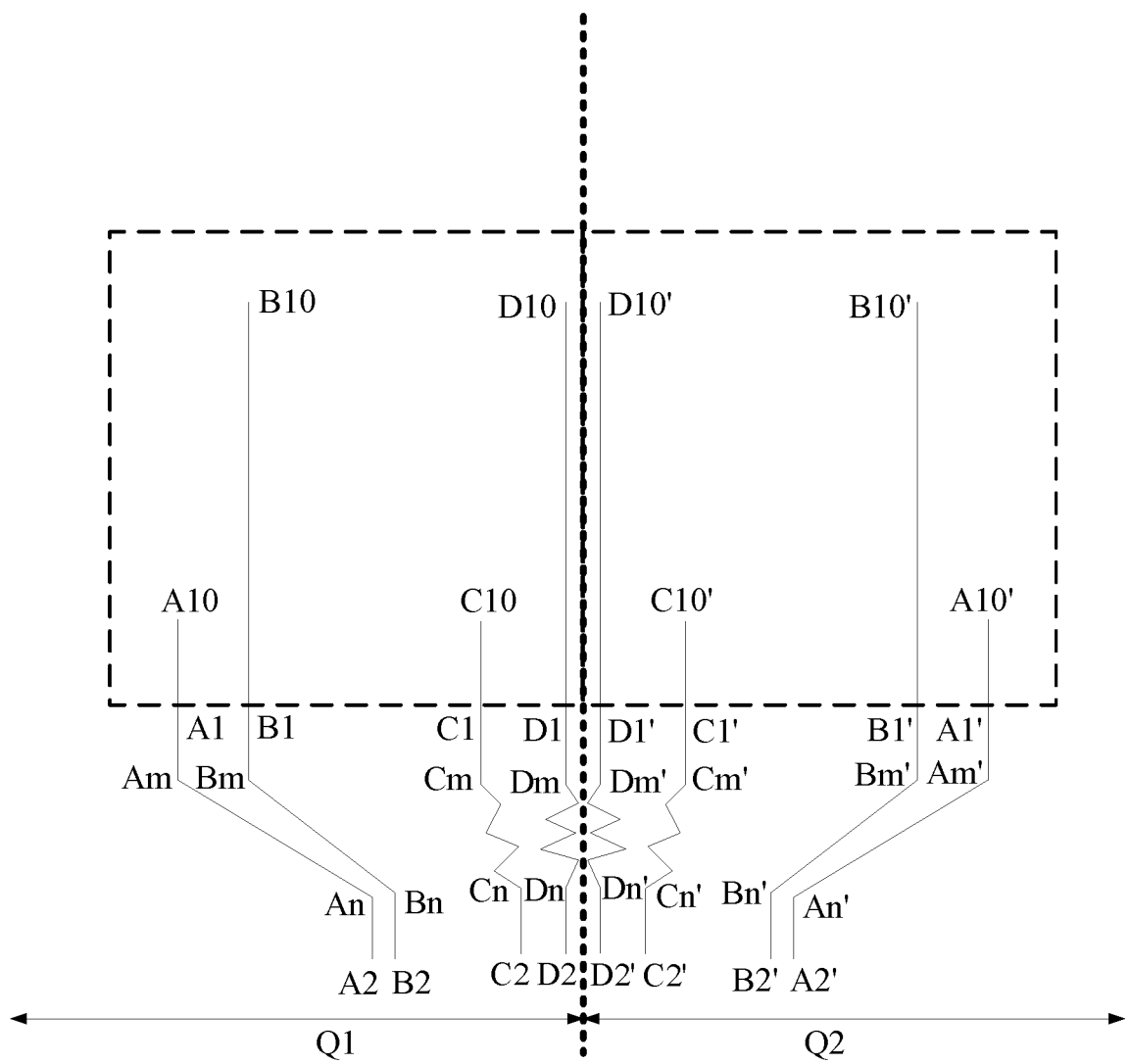

Alternatively, as shown in FIG. 12D, the second sub-voltage lines (A1_A2, B1_B2, C1_C2, A1'_A2', B1'_B2', C1'_C2') are the same in length and width; the second sub-voltage line (A1_A2, B1_B2, C1_C2, A1'_A2', B1'_B2', C1'_C2') includes a first vertical part (A1_Am, B1_Bm, C1_Cm, D1_Dm, A1'_Am', B1'_Bm', C1'_Cm', D1'_Dm') connected correspondingly to the first sub-voltage line (A1_A10, B1_B10 . . . C1_C10, D1_D10, A1'_A10', B1'_B10' . . . C1'_C10', D1'_D10'), an inclined part (An_Am, Bn_Bm, Cn_Cm, Dn_Dm, An'_Am', Bn'_Bm', Cn'_Cm', Dn'_Dm') connected to the first vertical part (A1_Am, B1_Bm, C1_Cm, D1_Dm, A1'_Am', B1'_Bm', C1'_Cm', D1'_Dm'), and a second vertical part (An_A2, Bn_B2, Cn_C2, Dn_D2, An'_A2', Bn'_B2', Cn'_C2', Dn'_D2') connected to the inclined part (An_Am, Bn_Bm, Cn_Cm, Dn_Dm, An'_Am', Bn'_Bm', Cn'_Cm', Dn'_Dm'); all first vertical parts (A1_Am, B1_Bm, C1_Cm, D1_Dm, A1'_Am', B1'_Bm', C1'_Cm', D1'_Dm') are same in length and width, all second vertical parts (An_A2, Bn_B2, Cn_C2, Dn_D2, An'_A2', Bn'_B2', Cn'_C2', Dn'_D2') are same in length and width, the inclined part (for example, An_Am, Bn_Bm, An'_Am', Bn'_Bm') with the longest length is a straight line, and each inclined part (Cn_Cm, Dn_Dm, Cn'_Cm', Dn'_Dm') with a shorter length may be a broken line. Of course, each inclined part (Cn_Cm, Dn_Dm, Cn'_Cm', Dn'_Dm') with a shorter length may also be a curve.

By optimizing the design of the negative lead wires, the resistances of the negative lead wires corresponding to the lamp areas are equal, and then the negative IR drop of each lamp area can be eliminated.

It should be noted that FIG. 12C and FIG. 12D only illustrate the embodiment in which the resistance values of the second sub-voltage lines are the same. Of course, the first sub-voltage lines in FIG. 12C and FIG. 12D may be any of those in FIG. 11A and FIG. 11B.

Therefore, FIGS. 12A to 12D provided by the embodiments of the disclosure solve the problem of the negative IR drop of LEDs in the light-emitting area AA. Of course, the disclosure is not limited to the several implementations listed in the embodiments of the disclosure. For example, the lengths and widths of the negative voltage lines with different lengths may also be set to be the same, wherein the entire longer negative voltage line is set as a straight line, and the entire shorter negative voltage line is set as a broken line or curve; or the entire longer negative voltage line is set to be thicker, and the entire shorter negative voltage line is set to be thinner. All implementations belong to the protection scope of the embodiments of the disclosure as long as the resistance values of the negative voltage lines are the same.

It should be noted that the embodiments of the disclosure take the case where the positive IR drop is reduced by separately setting the wiring manner of the positive voltage lines or the case where the positive and negative IP drops are reduced by simultaneously setting the wiring manners of the positive voltage lines and the negative voltage lines as an example. Of course, in a specific implementation, it is also possible to reduce the negative IP drop only by the wiring manner of the negative voltage lines provided by the embodiments of the disclosure. The separate setting of the wiring manner of the negative voltage lines can refer to the previous description, and will not be repeated herein.

To sum up, in the embodiments of the disclosure, by adjusting the widths or lengths of the positive voltage lines and the negative voltage lines of the light-emitting substrate, and by the above design of the positive voltage lines and the negative voltage lines, the positive IR drop between LEDs is effectively reduced, and the negative IR drop between LEDs is effectively reduced, so that the IR drops of the positive and negative poles of LEDs in different areas of the light-emitting substrate are significantly reduced, and the uniformity of the luminous brightness of the light-emitting substrate is significantly improved.

Based on the same inventive concept, an embodiment of the disclosure further provides a display device, including the above-mentioned light-emitting substrate provided by the embodiments of the disclosure. Since the principle of the display device to solve the problem is similar to that of the above-mentioned light-emitting substrate, the implementations of the display device can refer to the implementations of the above-mentioned light-emitting substrate, and the repeated description thereof will be omitted. The display device may be: a mobile phone, a tablet, a television, a display, a laptop, a digital photo frame, a navigator, or any other product or component with display or touch function.

In a specific implementation, the above-mentioned display device according to the embodiment of the disclosure may be a liquid crystal display device.

In a specific implementation, the above-mentioned display device according to the embodiment of the disclosure may also include other functional structures well known to those skilled in the art, which will not be described in detail herein.

The embodiments of the disclosure provide a light-emitting substrate and a display device, where a plurality of light-emitting control units are divided into at least two areas, and then a different positive voltage line is used in each area to apply a positive voltage to the light-emitting control units in the corresponding area, so that the number of sub-light-emitting units driven by each positive voltage line is at least halved, which can effectively reduce the positive IR drop caused by the positive voltage line between the sub-light-emitting units, so that the positive voltage difference between the sub-light-emitting units is greatly reduced, thereby improving the uniformity of luminous brightness of each area of the light-emitting substrate.

Although the preferred embodiments of the disclosure have been described, those skilled in the art can make additional alterations and modifications to these embodiments once they learn about the basic creative concepts. Thus, the attached claims are intended to be interpreted to include the preferred embodiments as well as all the alterations and modifications falling within the scope of the disclosure.

Evidently, those skilled in the art can make various modifications and variations to the embodiments of the disclosure without departing from the spirit and scope of the embodiments of the disclosure. Thus, the disclosure is also intended to encompass these modifications and variations to the embodiments of the disclosure as long as these modifications and variations come into the scope of the claims of the disclosure and their equivalents.

What is claimed is:

1. A light-emitting substrate having a light-emitting area and a peripheral area arranged around the light-emitting area, comprising:
   a plurality of light-emitting control units distributed in an array in the light-emitting area; wherein each of the light-emitting control units comprises at least one sub-light-emitting unit, and the plurality of light-emitting control units are divided into at least two areas; and
   at least two positive voltage lines located in the peripheral area and respectively located on opposite sides of the plurality of light-emitting control units; wherein sub-light-emitting units of light-emitting control units in a same area are electrically connected to a same positive voltage line, and sub-light-emitting units of light-emitting control units in different areas are electrically connected to different positive voltage lines;
   wherein the positive voltage line with a longest linear distance in the column direction is a straight line, and each positive voltage line with a shorter linear distance in the column direction is a broken line or a curve;
   wherein light-emitting control units in each area are divided into at least two sub-areas in a column direction, sub-light-emitting control units of light-emitting control units in a same sub-area are electrically connected to a same positive voltage line, and sub-light-emitting units of light-emitting control units in different sub-areas are electrically connected to different positive voltage lines; and each positive voltage line extends to a lead area of the peripheral area;

wherein each positive voltage line comprises a first end in the lead area and a second end away from the lead area; a bottom edge of a last row of light-emitting control units in each area is a first horizontal reference line, and first parts of the positive voltage lines between the first horizontal reference line and the first end are same in length and width; and a top side of a last row of sub-light-emitting units in the light-emitting control units in each sub-area is a second horizontal reference line, and second parts of the positive voltage lines between respective second horizontal reference lines and respective second ends are same in length and width.

2. The light-emitting substrate according to claim 1, wherein
the positive voltage lines corresponding to the light-emitting control units in each area extend in the column direction and are arranged in the row direction; and
each positive voltage line has a same resistance value.

3. The light-emitting substrate according to claim 2, wherein,
for a third part of each positive voltage line except the first part and the second part, widths of third parts decrease sequentially in a direction where lengths of the third parts are from large to small; or, the third parts are same in length and width, the third part with a longest linear distance in the column direction is a straight line, and each third part with a shorter linear distance in the column direction is a broken line or a curve.

4. The light-emitting substrate according to claim 1, further comprising a plurality of connection lines extending in the row direction, wherein the positive voltage lines are electrically connected to the sub-light-emitting units through the corresponding connection lines, and the connection lines have a same resistance value.

5. The light-emitting substrate according to claim 4, wherein the light-emitting control units in each area are divided into at least two sub-areas in the column direction, and the connection lines electrically connected to the light-emitting control units in each sub-area comprise first sub-connection lines located in the light-emitting area and second sub-connection lines located in the peripheral area;
in the column direction, lengths and widths of the second sub-connection lines corresponding to the light-emitting control units in different sub-areas decrease sequentially;
or, the second sub-connection lines corresponding to the light-emitting control units in different sub-areas are same in length and width, the second sub-connection line with a longest linear distance in the row direction is a straight line, and each second sub-connection line with a shorter linear distance in the row direction is a broken line or a curve.

6. The light-emitting substrate according to claim 1, further comprising a plurality of negative voltage lines, wherein each of the light-emitting control units is electrically connected to at least one of the negative voltage lines, different light-emitting control units are electrically connected to different negative voltage lines, the negative voltage lines are led out from the light-emitting area to the lead area of the peripheral area, and the negative voltage lines have a same resistance value.

7. The light-emitting substrate according to claim 6, wherein each of the negative voltage lines comprises a first sub-voltage line located in the light-emitting area and a second sub-voltage line located in the lead area, each first sub-voltage line has a same resistance value, and each second sub-voltage line has a same resistance value.

8. The light-emitting substrate according to claim 7, wherein a width of the first sub-voltage line with a longer length is greater than a width of the first sub-voltage line with a shorter length;
or, the first sub-voltage lines are same in length and width, wherein the first sub-voltage line with a longest linear distance in the column direction is a straight line, and the first sub-voltage line with a shorter linear distance in the column direction is a broken line or a curve.

9. The light-emitting substrate according to claim 7, wherein a width of the second sub-voltage line with a longer length is greater than a width of the second sub-voltage line with a shorter length;
or, the second sub-voltage lines are same in length and width; each of the second sub-voltage lines comprises a first vertical part connected to the first sub-voltage line, an inclined part connected to the first vertical part, and a second vertical part connected to the inclined part; all first vertical parts are same in length and width, all second vertical parts are same in length and width, the inclined part with a longest length is a straight line, and each inclined part with a shorter length is a broken line or a curve.

10. The light-emitting substrate according to claim 1, wherein each of the light-emitting control units comprises a plurality of sub-light-emitting units with different light-emitting colors distributed in an array, the sub-light-emitting units in a same column have a same light-emitting color, the sub-light-emitting units of different light-emitting color columns are arranged alternately in the row direction, and the sub-light-emitting units of each light-emitting color comprise m rows and n columns;
in each of the light-emitting control units, a quantity of connection lines electrically connected to the positive voltage line and extending in the row direction is p, $1 \leq p \leq m$, p is a positive integer, m is a positive integer, m/p is a positive integer, and m/p represents that m is divided by p to obtain a positive integer;
m/p sub-light-emitting units among m sub-light-emitting units with a same light-emitting color in a same column are connected in series; and
a quantity of negative voltage lines comprised in each light-emitting control unit is at least same as a quantity of light-emitting colors.

11. The light-emitting substrate according to claim 10, wherein the sub-light-emitting units comprise a red sub-light-emitting unit, a green sub-light-emitting unit and a blue sub-light-emitting unit.

12. The light-emitting substrate according to claim 1, wherein each of the light-emitting control units comprises m rows and n columns of sub-light-emitting units with a same light-emitting color distributed in an array; and in each of the light-emitting control units, a quantity of connection lines electrically connected to the positive voltage line and extending in the row direction is p, $1 \leq p \leq m$, p is a positive integer, m is a positive integer, m/p is a positive integer, and m/p represents that m is divided by p to obtain a positive integer; and
m/p sub-light-emitting units among m sub-light-emitting units in a same column are connected in series.

13. The light-emitting substrate according to claim 12, wherein the sub-light-emitting unit is a blue sub-light-emitting unit.

14. The light-emitting substrate according to claim 1, wherein the sub-light-emitting unit is a Mini LED or Micro LED.

15. A display device, comprising a light-emitting substrate, wherein the light-emitting substrate having a light-emitting area and a peripheral area arranged around the light-emitting area comprises:
- a plurality of light-emitting control units distributed in an array in the light-emitting area; wherein each of the light-emitting control units comprises at least one sub-light-emitting unit, and the plurality of light-emitting control units are divided into at least two areas; and
- at least two positive voltage lines located in the peripheral area and respectively located on opposite sides of the plurality of light-emitting control units; wherein sub-light-emitting units of light-emitting control units in a same area are electrically connected to a same positive voltage line, and sub-light-emitting units of light-emitting control units in different areas are electrically connected to different positive voltage lines;
- wherein the positive voltage line with a longest linear distance in the column direction is a straight line, and each positive voltage line with a shorter linear distance in the column direction is a broken line or a curve;
- wherein light-emitting control units in each area are divided into at least two sub-areas in a column direction, sub-light-emitting control units of light-emitting control units in a same sub-area are electrically connected to a same positive voltage line, and sub-light-emitting units of light-emitting control units in different sub-areas are electrically connected to different positive voltage lines; and each positive voltage line extends to a lead area of the peripheral area;
- wherein each positive voltage line comprises a first end in the lead area and a second end away from the lead area; a bottom edge of a last row of light-emitting control units in each area is a first horizontal reference line, and first parts of the positive voltage lines between the first horizontal reference line and the first end are same in length and width; and
- a top side of a last row of sub-light-emitting units in the light-emitting control units in each sub-area is a second horizontal reference line, and second parts of the positive voltage lines between respective second horizontal reference lines and respective second ends are same in length and width.

16. The display device according to claim 15, wherein the positive voltage lines corresponding to the light-emitting control units in each area extend in the column direction and are arranged in the row direction; and each positive voltage line has a same resistance value.

* * * * *